US012765388B2

(12) United States Patent
Lin et al.

(10) Patent No.: US 12,765,388 B2
(45) Date of Patent: Oct. 13, 2026

(54) STACKED TRANSISTOR PHYSICALLY UNCLONABLE FUNCTION

(71) Applicant: TAIWAN SEMICONDUCTOR MANUFACTURING COMPANY, LTD., Hsinchu (TW)

(72) Inventors: Chien-Chen Lin, Hsinchu (TW); Wei Min Chan, Hsinchu (TW); Chun-Tse Chou, Hsinchu (TW); Chien Hui Huang, Hsinchu (TW); Yung-Ning Tu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 392 days.

(21) Appl. No.: 18/509,567

(22) Filed: Nov. 15, 2023

(65) Prior Publication Data

US 2024/0413100 A1 Dec. 12, 2024

Related U.S. Application Data

(60) Provisional application No. 63/507,235, filed on Jun. 9, 2023.

(51) Int. Cl.
*H10D 30/67* (2025.01)
*G11C 7/06* (2006.01)
(Continued)

(52) U.S. Cl.
CPC ............. *H10W 42/405* (2026.01); *G11C 7/06* (2013.01); *G11C 7/24* (2013.01); *H10D 30/014* (2025.01); *H10D 30/43* (2025.01); *H10D 30/6729* (2025.01); *H10D 30/6735* (2025.01); *H10D 62/121* (2025.01); *H10D 84/0186* (2025.01); *H10D 84/038* (2025.01);
(Continued)

(58) Field of Classification Search
CPC .. H10D 30/6735; H10D 30/014; H10D 30/43; H10D 30/6757; H10D 62/121; H10D 62/151; H10D 64/017; H10D 64/018; H10D 84/0128; H10D 84/013; H10D 84/0147; H10D 84/038; H10D 84/83
See application file for complete search history.

(56) References Cited

U.S. PATENT DOCUMENTS

| | | | | |
|---|---|---|---|---|
| 12,598,801 B2 * | 4/2026 | Chung | .................. | H10D 84/83 |
| 2023/0413504 A1 * | 12/2023 | Liu | ...................... | H10B 10/125 |
| 2024/0203485 A1 | 6/2024 | Noel et al. | | |

* cited by examiner

*Primary Examiner* — Tan N Tran
(74) *Attorney, Agent, or Firm* — Hauptman Ham, LLP

(57) ABSTRACT

An IC device includes a first and second stacked transistor structures including respective first and second and third and fourth transistors in a semiconductor substrate, first and second bit lines and a word line on one of a front or back side of the semiconductor substrate, and a power supply line on the other of the front or back side. The first transistor includes a source/drain (S/D) terminal electrically connected to the first bit line, a S/D terminal electrically connected to a S/D terminal of the second transistor, and a gate electrically connected to the word line, the third transistor includes a S/D terminal electrically connected to the second bit line, a S/D terminal electrically connected to a S/D terminal of the fourth transistor, and a gate electrically connected to the word line, and the second and fourth transistors include S/D terminals electrically connected to the power supply line.

20 Claims, 16 Drawing Sheets

(51) Int. Cl.

| | |
|---|---|
| ***G11C 7/24*** | (2006.01) |
| ***H10D 30/01*** | (2025.01) |
| ***H10D 30/43*** | (2025.01) |
| ***H10D 62/10*** | (2025.01) |
| ***H10D 84/01*** | (2025.01) |
| ***H10D 84/03*** | (2025.01) |
| ***H10D 84/85*** | (2025.01) |
| ***H10D 88/00*** | (2025.01) |
| ***H10W 20/41*** | (2026.01) |
| ***H10W 42/40*** | (2026.01) |

(52) U.S. Cl.
CPC ........... *H10D 84/856* (2025.01); *H10D 88/01* (2025.01); *H10W 20/427* (2026.01)

STACKED TRANSISTOR PHYSICALLY UNCLONABLE FUNCTION

PRIORITY CLAIM

The present application claims the priority of U.S. Provisional Application No. 63/507,235, filed Jun. 9, 2023, which is incorporated herein by reference in its entirety.

BACKGROUND

The semiconductor integrated circuit (IC) industry produces a variety of analog and digital devices to meet design needs in a number of different areas. Developments in semiconductor process technology have progressively reduced component sizes and tightened spacing resulting in progressively increased transistor density.

A physically unclonable function (PUF) is a physical device that, for a given input and conditions (e.g., challenge), outputs a physically defined digital fingerprint response that serves as a unique identifier. PUFs are often used in applications with high security requirements, such as cryptography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
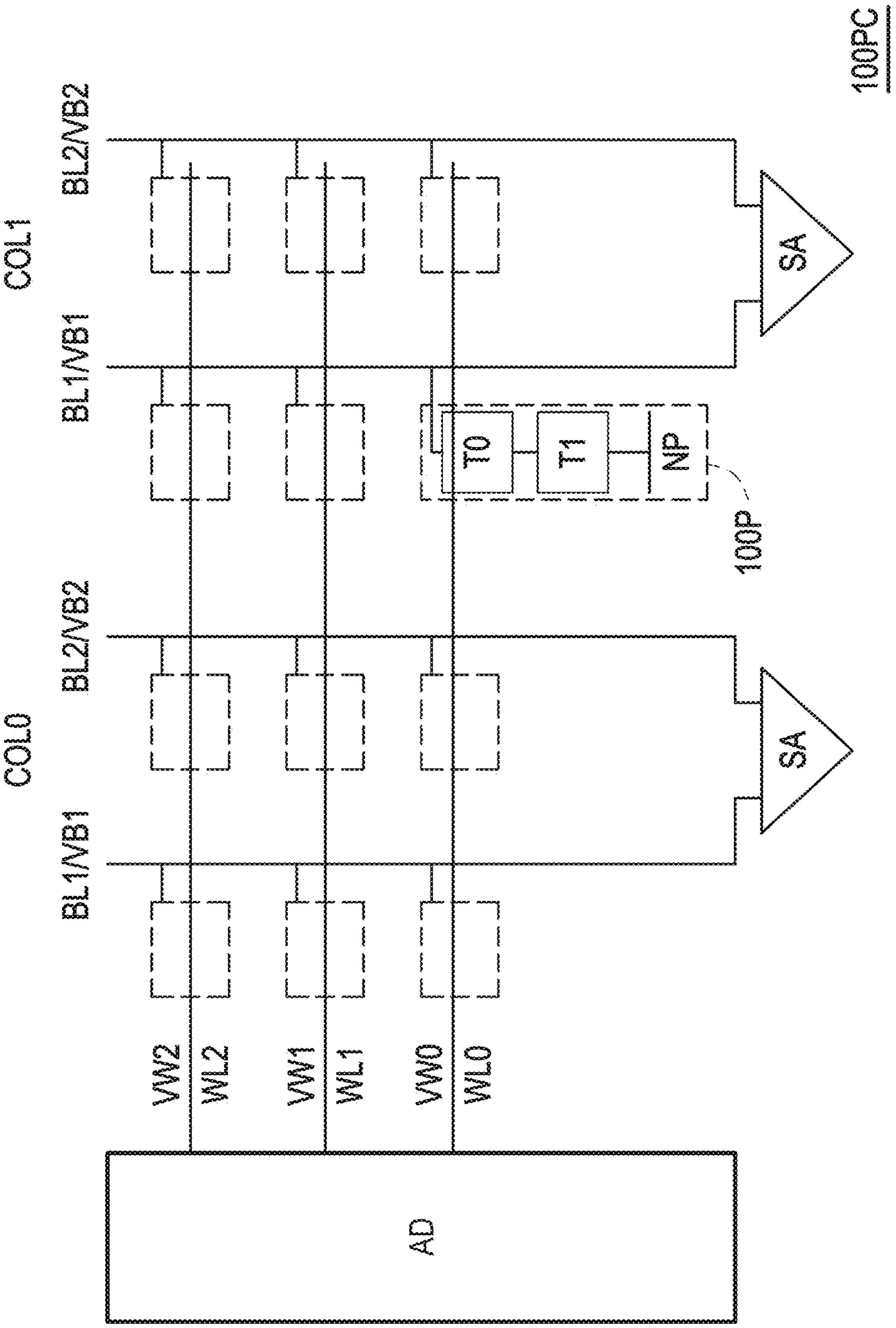
FIG. 1 is a schematic diagram of a physically unclonable function (PUF) circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a physically unclonable function (PUF) circuit, method of use, and method of manufacturing include a sense amplifier, first and second bit lines coupled to input terminals of the sense amplifier, a plurality of word lines, a power distribution node, and a column of device pairs in which each device pair includes first and second stacked transistors coupled in series between the first bit line and the power distribution node, third and fourth stacked transistors coupled in series between the second bit line and the power distribution node, and gates of the first and third transistors coupled to a corresponding word line of the plurality of word lines.

In operation, the device pairs output signals to the sense amplifier in response to bit and word line inputs based on physical differences such that each device pair is configured as a PUF device. PUF circuits based on the stacked transistor embodiments, also referred to as complementary field-effect transistor (CFET) cells in some embodiments, are thereby capable of providing unique identifier outputs using a smaller area and having less current leakage than other approaches, e.g., PUF circuits based on static random-access memory (SRAM) cells.

Figure 2B:
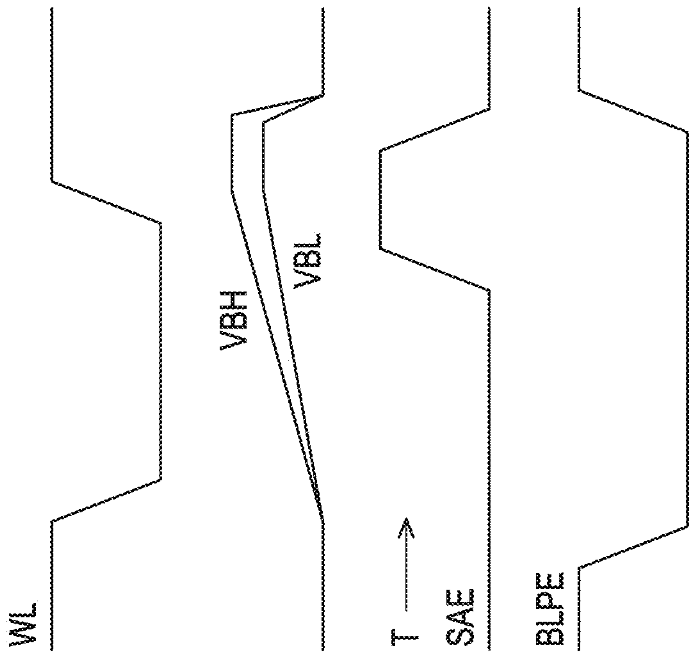
FIGS. 2A and 2B are diagrams of PUF circuit operating parameters, in accordance with some embodiments.
Figure 2A:
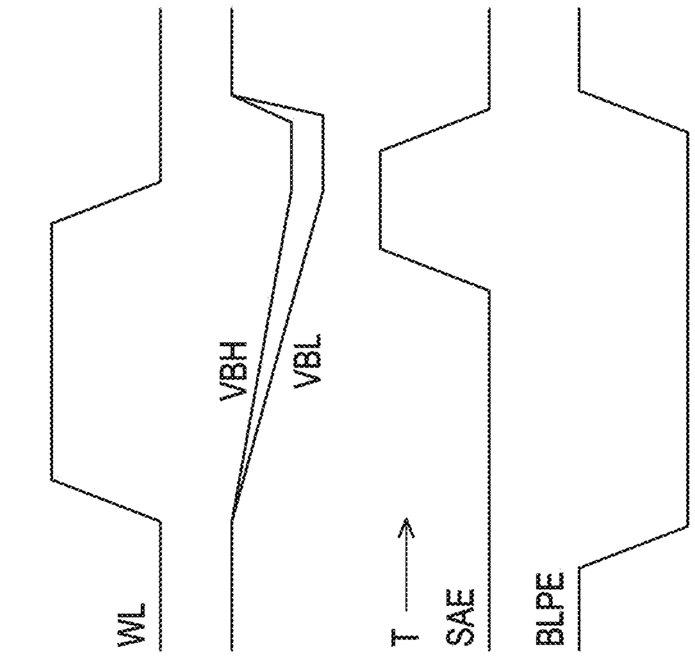
Figure 7B:
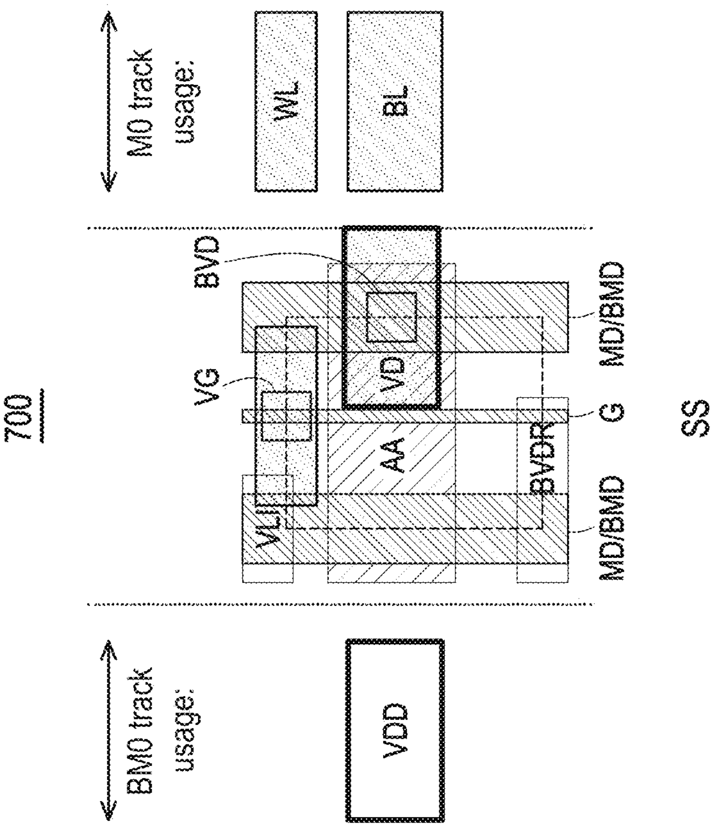
FIGS. 7A and 7B are diagrams of a stacked transistor PUF device, in accordance with some embodiments.
Figure 7A:
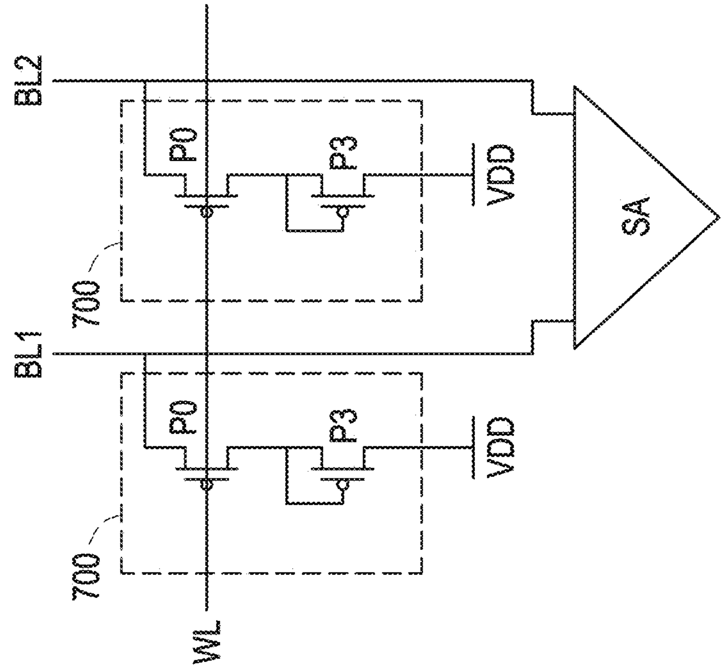
Figure 8B:
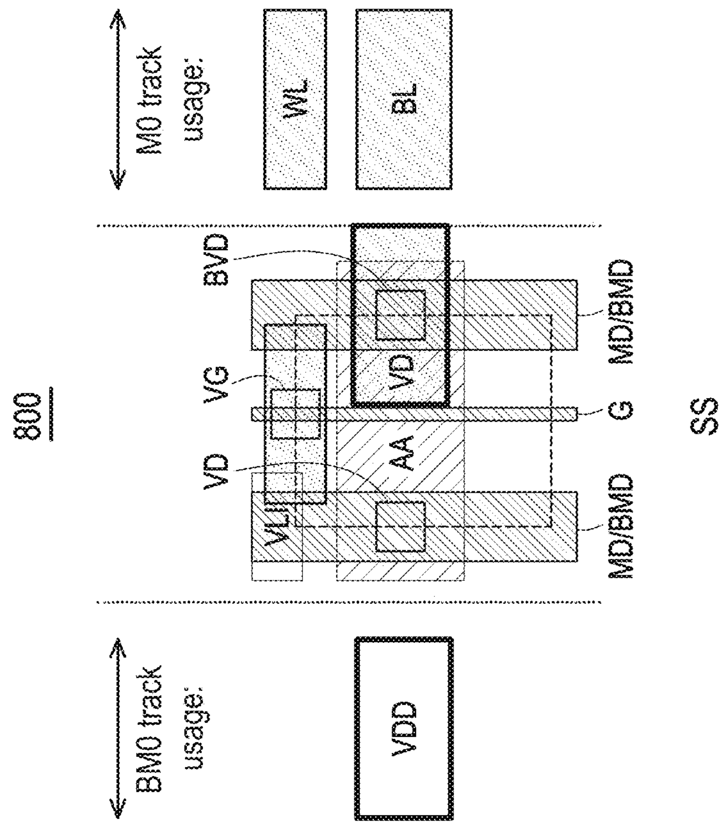
FIGS. 8A and 8B are diagrams of a stacked transistor PUF device, in accordance with some embodiments.
Figure 8A:
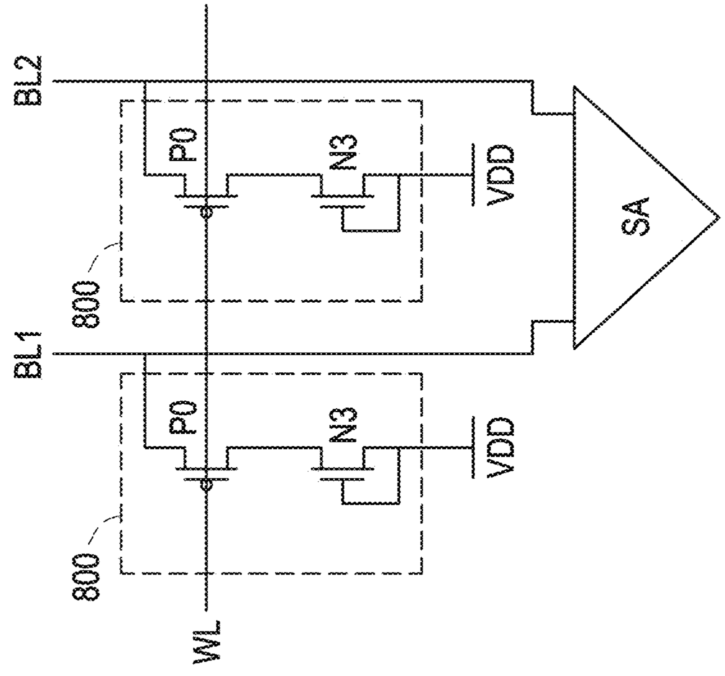
Figure 9:
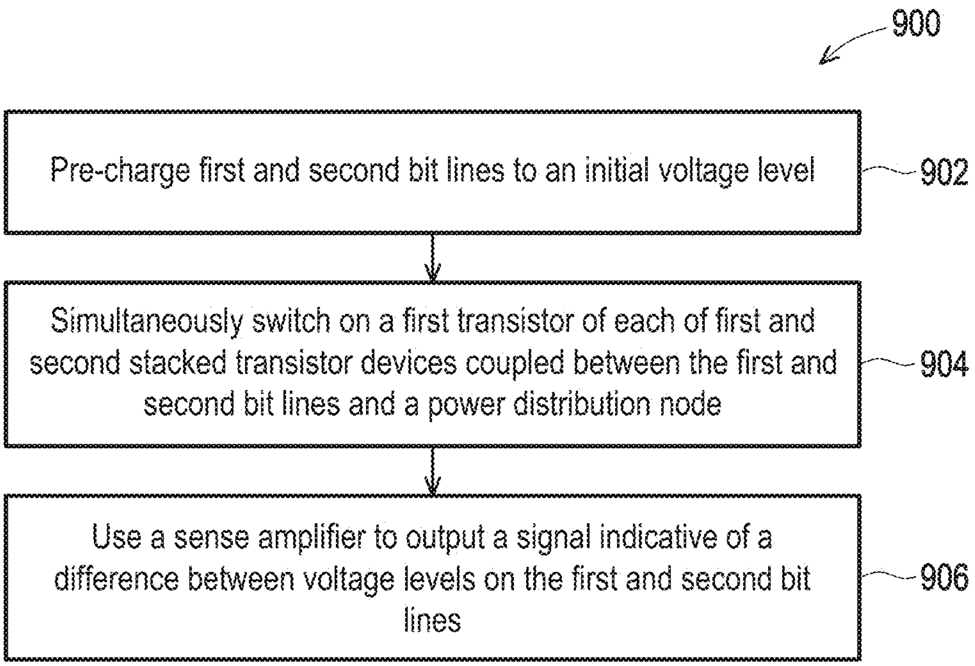
FIG. 9 is a flowchart of a method of operating a PUF circuit, in accordance with some embodiments.
Figure 10A:
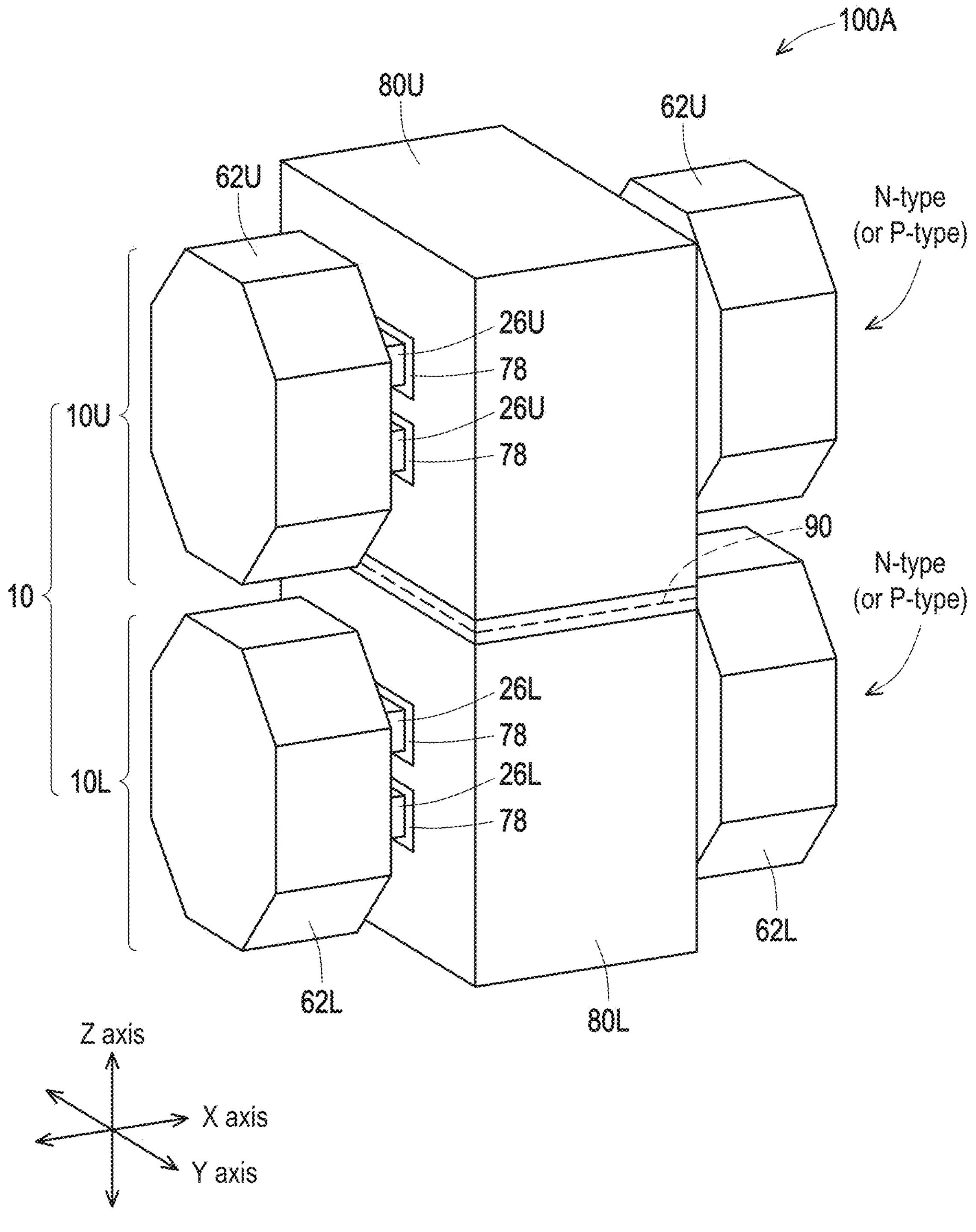
FIG. 10A is a schematic perspective view of a stacked transistor device, in accordance with some embodiments.
Figure 10B:
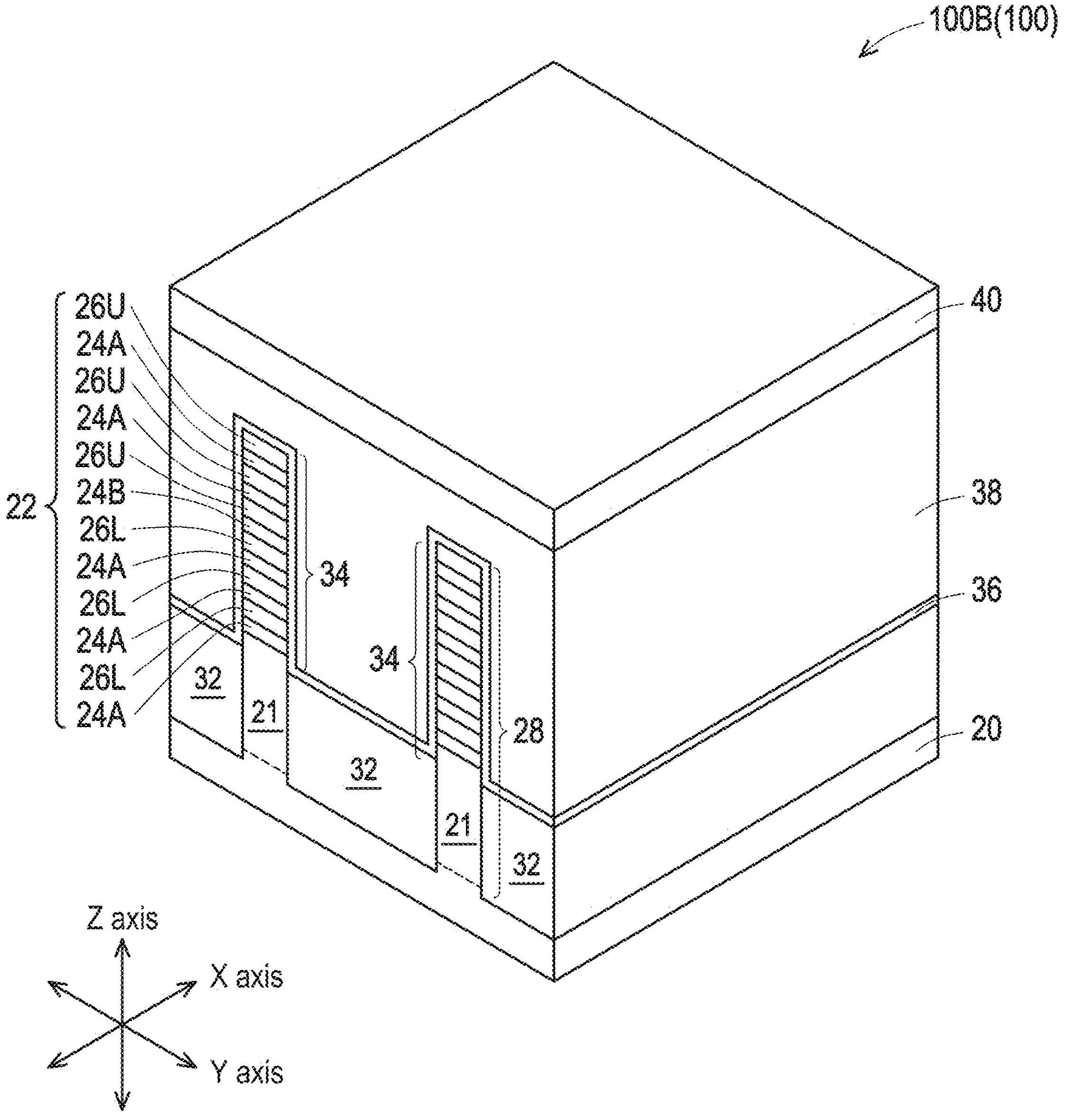
FIG. 10B is a schematic perspective view.
Figure 10C:
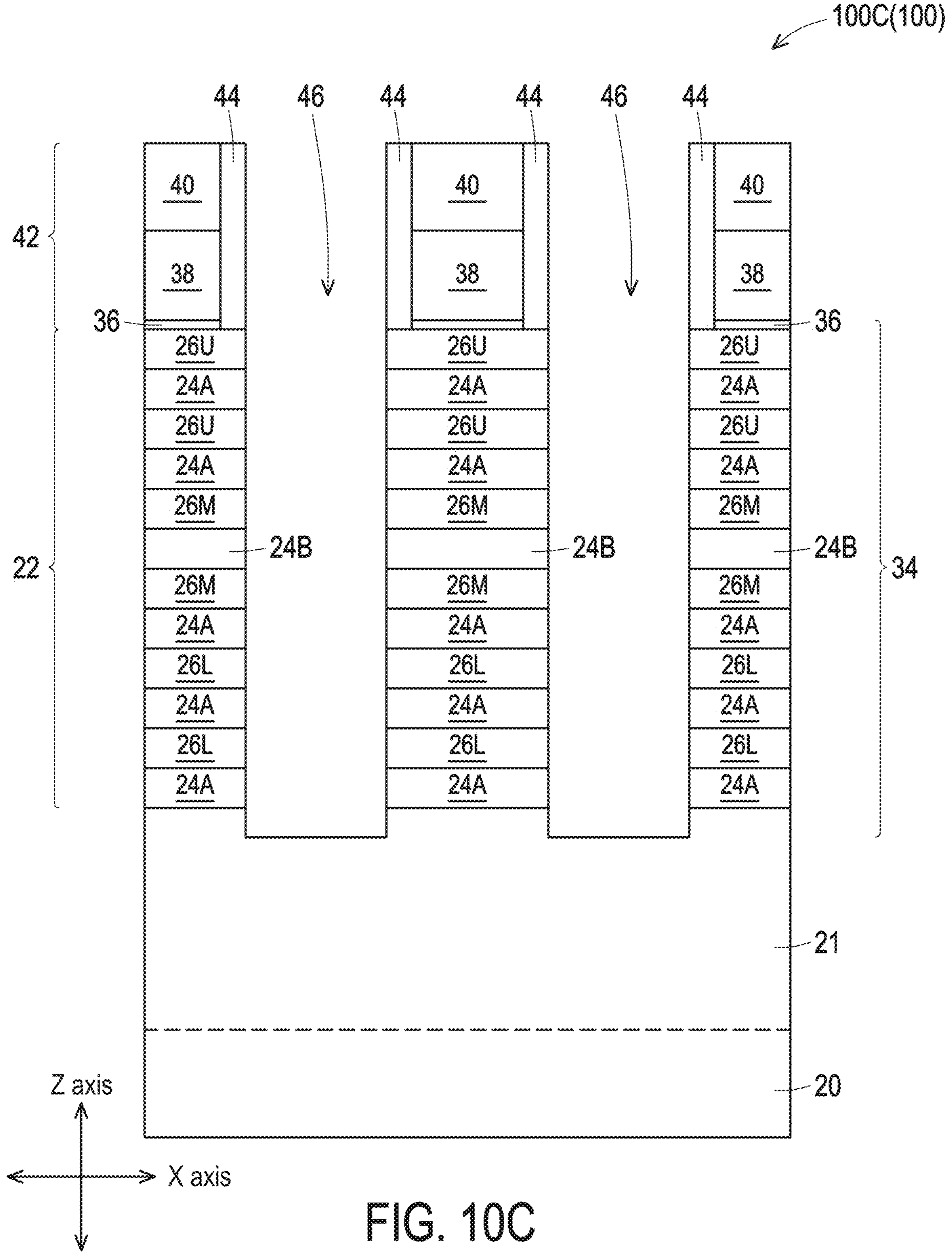
FIGS. 10C-10F are schematic cross-sectional views of a stacked transistor device at various stages in a manufacturing process, in accordance with some embodiments.
Figure 10D:
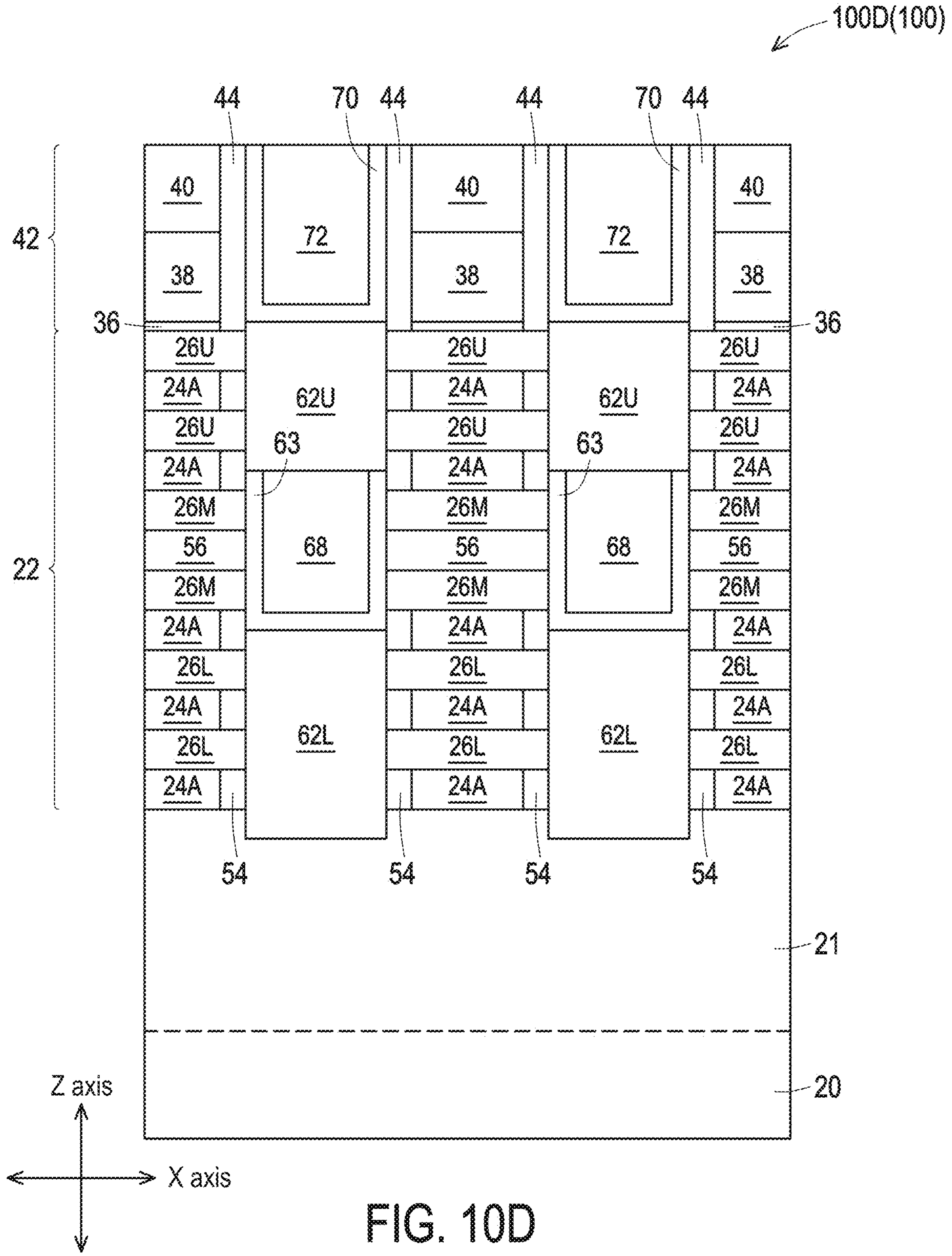
Figure 10E:
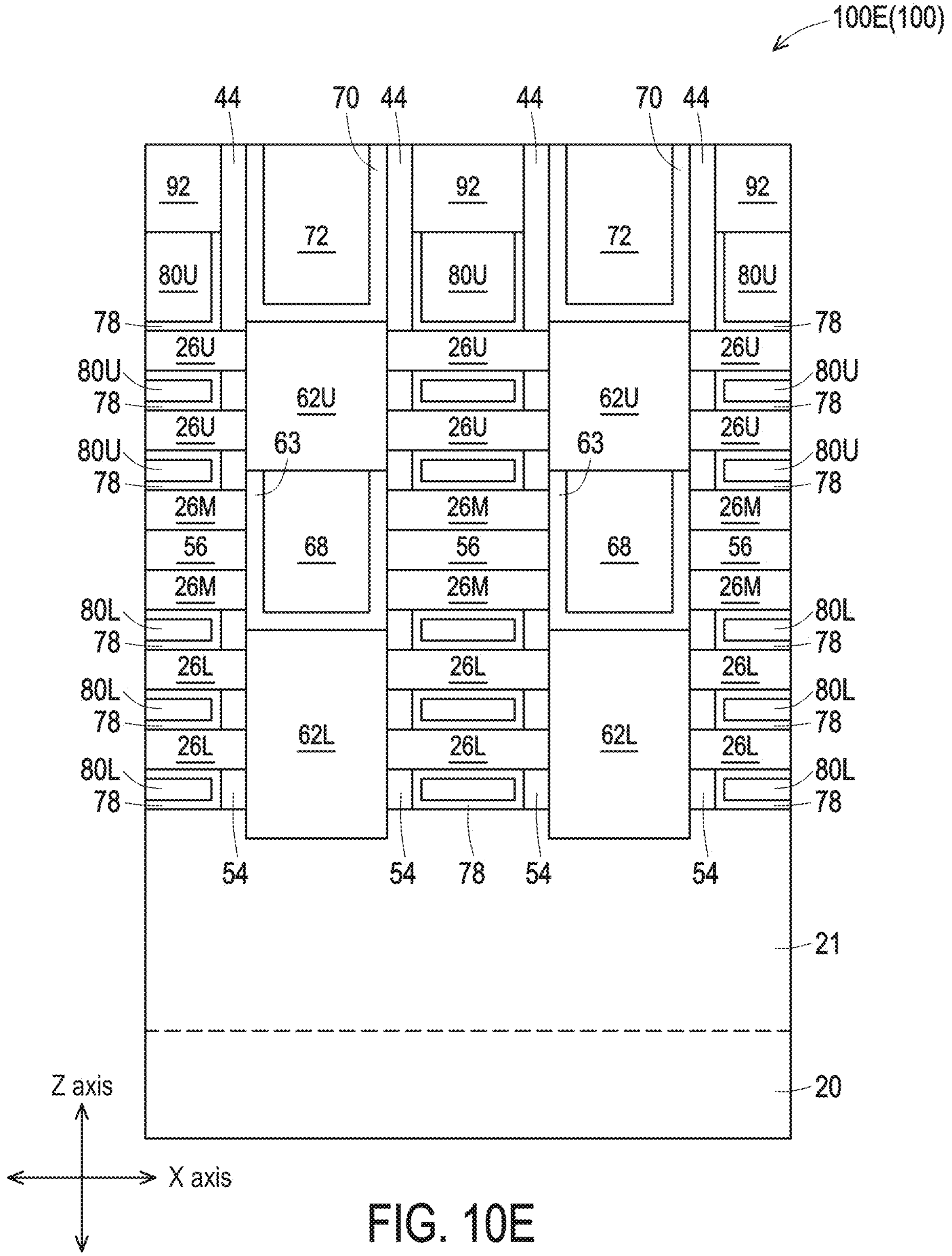
Figure 10F:
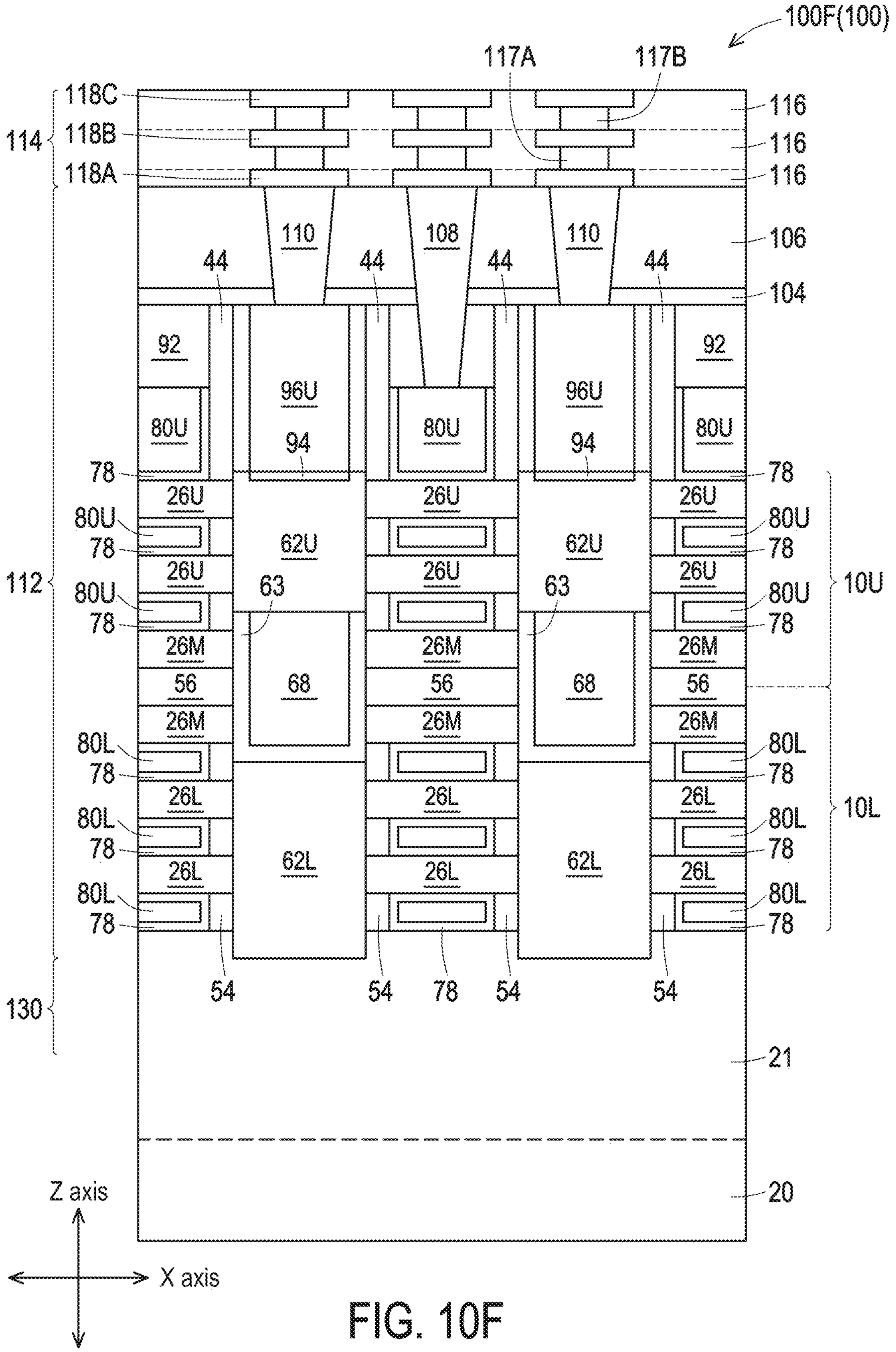
Figure 11:
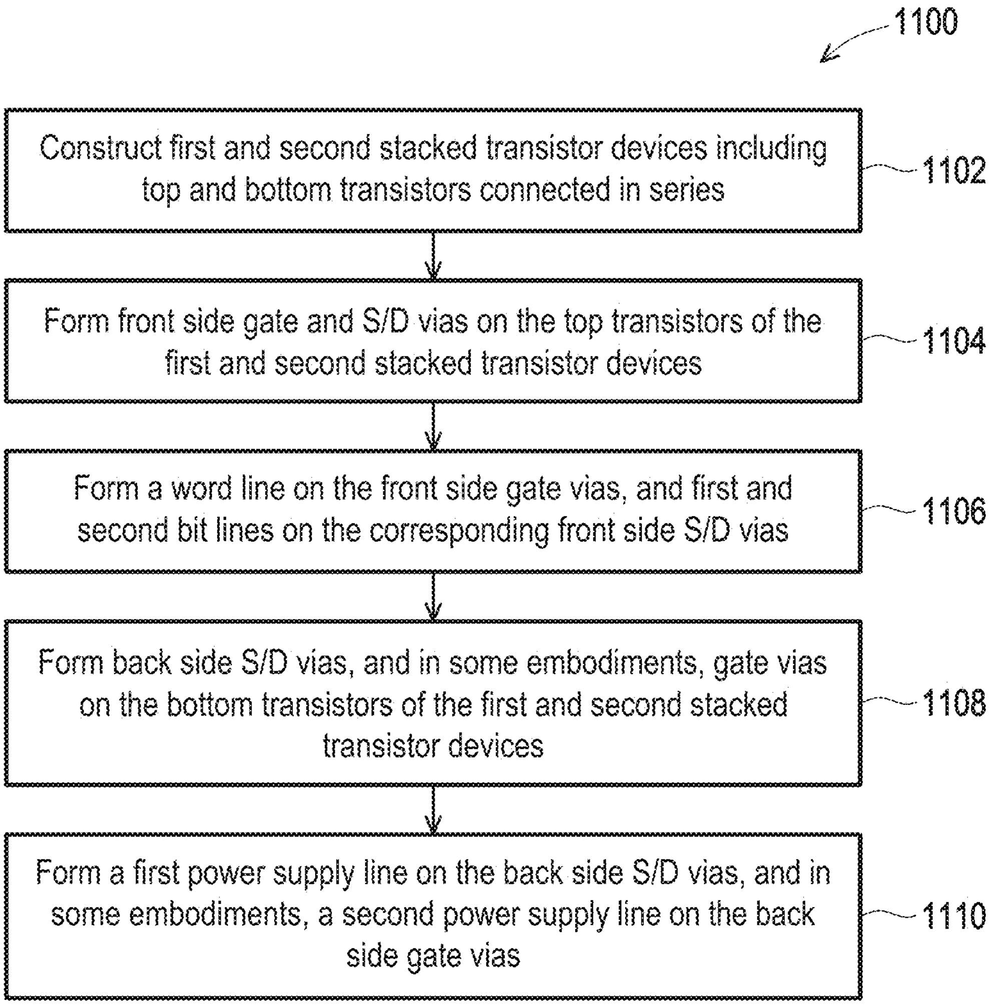
FIG. 11 is a flowchart of a method of manufacturing a stacked transistor PUF device, in accordance with some embodiments.

In accordance with various embodiments as discussed below, FIG. 1 is a schematic diagram of a PUF circuit 100PC including stacked transistor PUF devices 100P, FIGS. 2A and 2B are diagrams of PUF circuit operating parameters, FIGS. 3A-8B are diagrams of stacked transistor PUF devices 300-800 usable as stacked transistor PUF device 100P, FIG. 9 is a flowchart of a method 900 of operating a PUF circuit, FIGS. 10A-10F are views of a stacked transistor device at various stages in a manufacturing process, and FIG. 11 is a flowchart of a method of manufacturing a stacked transistor PUF device.

As depicted in FIG. 1, PUF circuit 100PC includes columns COL0 and COL1, each of which includes a pair of bit lines BL1 and BL2 coupled to a sense amplifier SA. Each pair of bit lines BL1 and BL2 is also coupled to corresponding pairs of stacked transistor PUF devices 100P, also referred to as PUF devices 100P in some embodiments, a single instance of which includes details and is labeled for the purpose of clarity. The pairs of PUF devices 100P are arranged in rows corresponding to word lines WL0-WL2 coupled to an address decoder AD.

FIG. 1 is simplified for the purpose of illustration. In various embodiments, PUF circuit 100PC includes features in addition to those depicted in FIG. 1, e.g., a control circuit, multiplexers or other selection circuits positioned between bit lines BL1/BL2 and sense amplifiers SA, one or more pre-charge circuits, or other suitable circuits.

In some embodiments, PUF circuit 100PC includes a single one of columns COL0 or COL1 or one or more columns in addition to columns COL0 and COL1. In some embodiments, PUF circuit 100PC includes a subset of the rows of PUF devices 100P and corresponding word lines WL0-WL2 or one or more rows of PUF devices 100P and corresponding word lines in addition to the rows of PUF devices 100P and corresponding word lines WL0-WL2.

Each sense amplifier SA is an electronic circuit configured to detect a voltage VB1 on bit line BL1 and a voltage VB2 on bit line BL2, and responsive to an enable signal, e.g., a signal SAE discussed below with respect to FIGS. 2A and 2B, generate an output signal (not shown) indicative of a difference between voltages VB1 and VB2. In some embodiments, a sense amplifier SA is configured to generate the output signal having a low logical level corresponding to a first one of voltages VB1 or VB2 greater than a second one of voltages VB1 or VB2, and having a high logical level corresponding to the second one of voltages VB1 or VB2 greater than the first one of voltages VB1 or VB2.

Address decoder AD, also referred to as decoder AD in some embodiments, is an electronic circuit configured to output word line signals VW0-VW2 on corresponding word lines WL0-WL2 responsive to an address signal (not shown). Decoder AD is configured to output a given word line signal VW0-VW2 having a first one of the low or high logical level responsive to the address signal having logical levels indicative of the corresponding one of word lines WL0-WL2, and having a second one of the low or high logical level responsive to the address signal having logical levels indicative of a word line other than the corresponding one of word lines WL0-WL2. In some embodiments, in operation, decoder AD outputting a given word line signal VW0-VW2 having the first one of the low or high logical level on the corresponding word line WL0-WL2 is referred to as activating the corresponding word line WL0-WL2.

Each PUF device 100P is an integrated circuit (IC) device including a stacked transistor structure (not shown in FIG. 1) positioned in a semiconductor substrate and including one of a first transistor T0 or a second transistor T1 overlying the other of the first transistor T0 or second transistor T1. In some embodiments, a PUF device 100P is referred to as a CFET device 100P. First transistor T0 and second transistor T1 are coupled in series between the corresponding one of bit line BL1 or BL2 and a first power distribution node NP configured to have a first one of a power supply voltage, e.g., VDD, or a reference voltage, e.g., VSS or ground.

First transistor T0 includes a first source/drain (S/D) terminal (not shown in FIG. 1) coupled to the corresponding bit line BL1 or BL2 and a gate (not shown in FIG. 1) coupled to the corresponding one of word lines WL0-WL2. In some embodiments, e.g., those discussed below with respect to FIGS. 3A-5B, first transistor T0 includes an n-type transistor and first power distribution node NP includes a reference voltage node configured to have the reference voltage. In some embodiments, e.g., those discussed below with respect to FIGS. 6A-8B, first transistor T0 includes a p-type transistor and first power distribution node NP includes a power supply voltage node configured to have the power supply voltage.

Second transistor T1 includes a first S/D terminal coupled to first power distribution node NP, and a second S/D terminal coupled to a second S/D terminal of the first transistor (not shown in FIG. 1).

In some embodiments, e.g., those discussed below with respect to FIGS. 3A, 3B, 6A, and 6B, second transistor T1 includes a same type transistor as first transistor T0, and includes a gate coupled to a second power distribution node (not shown in FIG. 1) configured to have a second one of the power supply or reference voltage.

In some embodiments, e.g., those discussed below with respect to FIGS. 4A, 4B, 7A, and 7B, second transistor T1 includes a same type transistor as first transistor T0, includes a gate coupled to the second S/D terminal of each of first transistor T0 and second transistor T1, and is thereby configured as a diode.

In some embodiments, e.g., those discussed below with respect to FIGS. 5A, 5B, 8A, and 8B, second transistor T1 includes an opposite type transistor as first transistor TO, includes a gate coupled to first power distribution node NP, and is thereby configured as a diode.

By having a configuration in accordance with the embodiments discussed above, PUF device 100P includes first transistor T0 configured to, in operation, selectively couple the corresponding bit line BL1 or BL2 to second transistor T1, and second transistor T1 configured to couple first transistor T0 to first power distribution node NP through a conductive channel. In various embodiments, the conductive channel corresponds to either second transistor T1 being switched on based on the voltage on the second power distribution node, or second transistor T1 being configured as a forward-biased diode.

FIGS. 2A and 2B are diagrams of non-limiting examples of PUF circuit 100PC operating parameters corresponding to generating outputs, in accordance with some embodiments. FIG. 2A corresponds to embodiments in which first transistor T0 includes an n-type transistor, and FIG. 2B corresponds to embodiments in which first transistor T0 includes a p-type transistor.

Each of FIGS. 2A and 2B depicts a word line signal WL corresponding to one of word line signals VW0-VW2, a voltage VBH corresponding to one of voltages VB1 or VB2, a voltage VBL corresponding to the other of voltages VB1 or VB2, a sense amplifier enable signal SAE, and a bit line pre-charge enable signal BLPE, each of which is a function of a time T.

As depicted in each of FIGS. 2A and 2B, bit line pre-charge enable signal BLPE has the high logical level before and after an output operation and the low logical level corresponding to the output operation. The high logical level corresponds to a bit line pre-charge circuit driving each of bit lines BL1 and BL2 to an initial voltage level, and the low logical level corresponds to the bit line pre-charge circuit floating each of bit lines BL1 and BL2. The initial voltage level is a high voltage level, e.g., VDD, in the embodiments depicted in FIG. 2A and a low voltage level, e.g., VSS, in the embodiments depicted in FIG. 2B.

Sense amplifier enable signal SAE has the low logical level before, after, and during a first portion of the output operation, and the high logical level during a second portion of the output operation corresponding to generating an output signal indicative of a difference between voltages VBH and VBL.

Word line signal WL includes a pulse corresponding to activating the corresponding one of word lines WL0-WL2 during a middle portion of the output operation, e.g., while bit line pre-charge enable signal BLPE has the low logical level. In the embodiments illustrated in FIG. 2A, the pulse corresponds to word line signal WL having the high voltage level capable of switching on first transistor T0 including an n-type transistor. In the embodiments illustrated in FIG. 2B, the pulse corresponds to word line signal WL having the low voltage level capable of switching on first transistor T0 including a p-type transistor.

In the embodiments depicted in FIG. 2A, in response to each of bit lines BL1 and BL2 being pre-charged to the high voltage level and subsequently floated by the bit line pre-charge circuit based on bit line pre-charge enable signal BLPE, and first transistor T0 subsequently being switched on based on word line signal WL, voltages VB1 and VB2 transition from the high voltage level to the low voltage level as bit lines BL1 and BL2 are discharged through transistors TO and T1.

In the embodiments depicted in FIG. 2B, in response to each of bit lines BL1 and BL2 being pre-discharged to the low voltage level and subsequently floated by the bit line pre-charge circuit based on bit line pre-charge enable signal BLPE, and first transistor T0 subsequently being switched on based on word line signal WL, voltages VB1 and VB2 transition from the low voltage level to the high voltage level as bit lines BL1 and BL2 are charged through transistors TO and T1.

The rates at which voltages VB1 and VB2 transition between the voltage levels are determined by physical characteristics of the corresponding instances of first transistor T0 and second transistor T1. Because the physical characteristics include process variations, one of voltages VB1 or VB2 transitions at a faster rate than the other of voltages VB1 or VB2.

In the embodiments depicted in FIG. 2A, the one of voltages VB1 or VB2 transitioning faster than the other of voltages VB1 or VB2 corresponds to voltage VBL, and the other of voltages VB1 or VB2 corresponds to voltage VBH. In the embodiments depicted in FIG. 2B, the one of voltages VB1 or VB2 transitioning faster than the other of voltages VB1 or VB2 corresponds to voltage VBH, and the other of voltages VB1 or VB2 corresponds to voltage VBL.

In response to sense amplifier enable signal SAE having the high logical level, sense amplifier SA is activated and generates the output signal based on the difference between voltages VBH and VBL and thereby based on the transition rates of voltages VB1 and VB2 determined by the physical differences between the instances of the corresponding pair of PUF devices 100P.

The signal configurations depicted in FIGS. 2A and 2B are non-limiting examples provided for the purpose of illustration. Other signal configurations, e.g., one or both of sense amplifier enable signal SAE or bit line pre-charge enable signal BLPE having logical levels complementary to those depicted in FIGS. 2A and 2B, are within the scope of the present disclosure.

As discussed above, PUF circuit 100PC based on PUF devices 100P is thereby configured to provide unique identifier outputs based on variations in the physical properties of the pairs of PUF devices 100P. Compared to other approaches, e.g., PUF circuits based on static random-access memory (SRAM) cells, PUF circuit 100PC is thereby capable of providing unique PUF outputs using a smaller area and having less current leakage.

FIGS. 3A-8B are diagrams of corresponding stacked transistor PUF devices 300-800, in accordance with some embodiments. Each of stacked transistor PUF devices 300-800 is usable as the PUF devices of the pairs of PUF devices 100P configured as discussed above with respect to FIGS. 1-2B.

Each of FIGS. 3A-8A is a schematic diagram of a corresponding pair of stacked transistor PUF devices 300-800 and includes bit lines BL1 and BL2, a word line WL corresponding to one of word lines WL0-WL2, and sense amplifier SA, each discussed above with respect to FIGS. 1-2B.

Each of PUF devices 300-500 includes an n-type transistor N0 configured as first transistor T0 discussed above, and a second transistor configured as second transistor T1, as further discussed below. In the embodiments depicted in FIGS. 3A-5B, first power distribution node NP is configured to have power supply voltage VDD and is referred to as a first power supply line in some embodiments. In some embodiments, a second power distribution node is configured to have reference voltage VSS and is referred to as a second power supply line in some embodiments.

Each of PUF devices 600-800 includes a p-type transistor P0 configured as first transistor T0 discussed above, and a second transistor configured as second transistor T1, as further discussed below. In the embodiments depicted in FIGS. 6A-8B, first power distribution node NP is configured to have reference voltage VSS and is referred to as the first power supply line in some embodiments. In some embodiments, a second power distribution node is configured to have power supply voltage VDD and is referred to as the second power supply line in some embodiments.

Each of FIGS. 3B-8B is a plan view of a non-limiting example layout and IC device of the corresponding stacked transistor PUF device 300-800 positioned in a semiconductor substrate SS. In each of the embodiments depicted in FIGS. 3B-8B, transistor N0 or P0 is positioned in substrate SS overlying (the transistor corresponding to) second transistor T1, word line WL and a bit line BL corresponding to each of bit lines BL1 and BL2 are positioned on a front side of substrate SS, and one or both of the first or second power supply lines are positioned on a back side of substrate SS.

Other arrangements of stacked transistor PUF devices 300-800, e.g., second transistor T1 positioned in substrate SS overlying transistor N0 or P0, are within the scope of the present disclosure.

Each of FIGS. 3B-8B includes a gate structure G intersected by an active area AA, metal-like defined (MD) segments MD and BMD overlapping active area AA, a local interconnect structure VLI, and vias VD, VG, and BVG arranged as discussed below, and including additional features in some embodiments.

A non-limiting example of a stacked transistor device and associated manufacturing method corresponding to the various features of stacked transistor PUF devices 300-800 is discussed below with respect to IC device 100 and FIGS. 10A-10F.

In each of the embodiments depicted in FIGS. 3A-8B, each of gate structure G and active area AA includes a top portion configured as the respective gate and conduction channel of transistor N0 or P0 and a bottom portion separated from the top portion by an insulation layer and configured as the respective gate and conduction channel of second transistor T1. The top portion of gate structure G (gate of transistor N0 or P0) is electrically coupled to word line WL through a front side via VG, and the bottom portion of gate structure G (gate of second transistor T1) is configured in accordance with the embodiments discussed below.

MD segments MD overlap the top portion of active area AA at locations corresponding to S/D terminals of transistor N0 or P0, and MD segments BMD overlap the bottom portion of active area AA at locations corresponding to S/D terminals of second transistor T1.

The first S/D terminal of transistor N0 or P0 is electrically connected to bit line BL through a front side via VD, the second S/D terminal of transistor N0 or P0 is electrically connected to the first S/D terminal of second transistor T1 through local interconnect structure VLI, and the second S/D terminal of second transistor T1 is electrically connected, through a back side via VD, to the first power supply line configured to have reference voltage VSS in the embodiments depicted in FIGS. 3A-5B and to have power supply voltage VDD in the embodiments depicted in FIGS. 6A-8B.

Figure 3B:
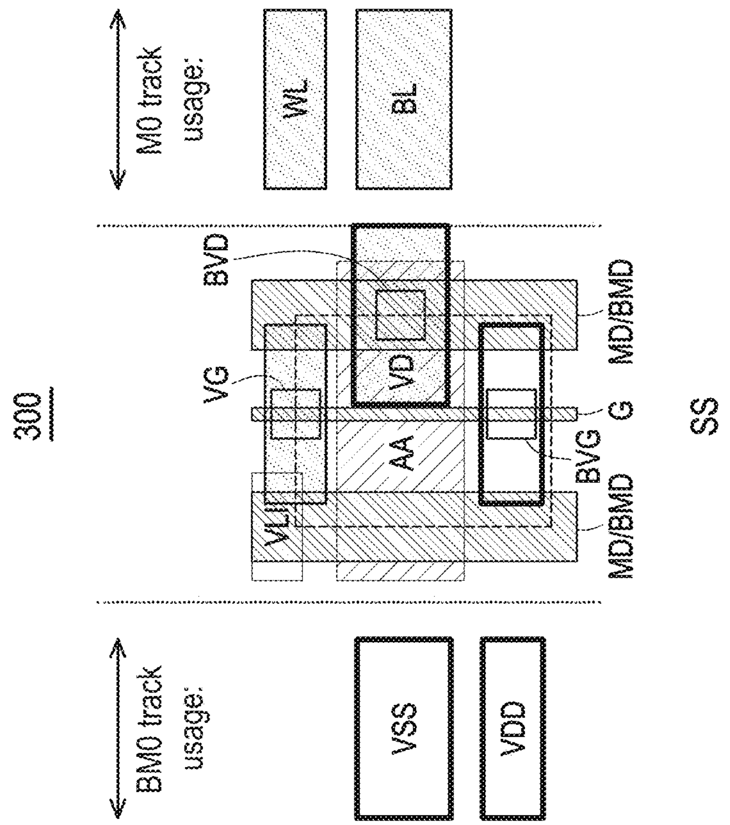
FIGS. 3A and 3B are diagrams of a stacked transistor PUF device, in accordance with some embodiments.
Figure 3A:
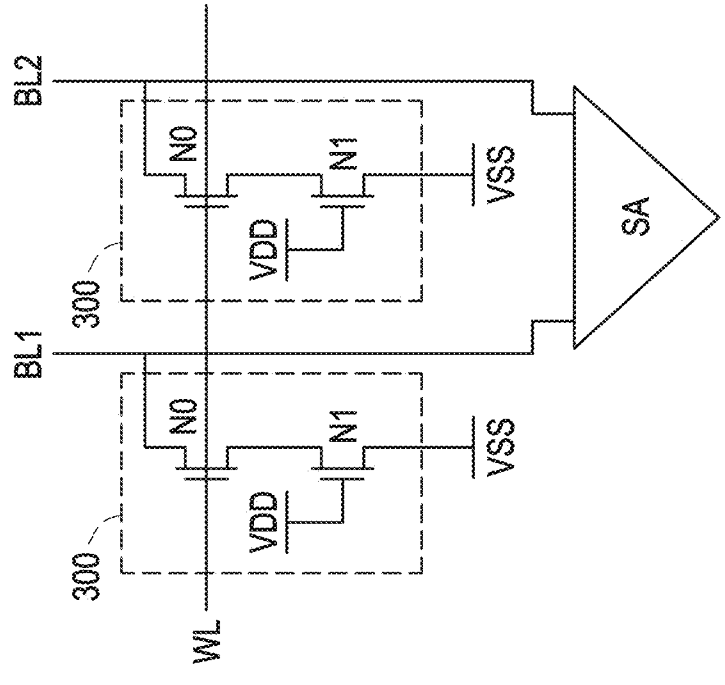

In the embodiment depicted in FIGS. 3A and 3B, each instance of PUF device 300 includes first transistor T0 including n-type transistor N0, and second transistor T1 including an n-type transistor N1 coupled between transistor N0 and the first power supply line configured to have reference voltage VSS. The gate of transistor N1 is electrically connected, through a back side via BVG, to a second power supply line configured to have power supply voltage VDD.

PUF device 300 thereby includes transistor N1 configured to, in operation, provide a current path between transistor N0 and the first power supply line by being switched on responsive to power supply voltage VDD and reference voltage VSS.

Figure 4B:
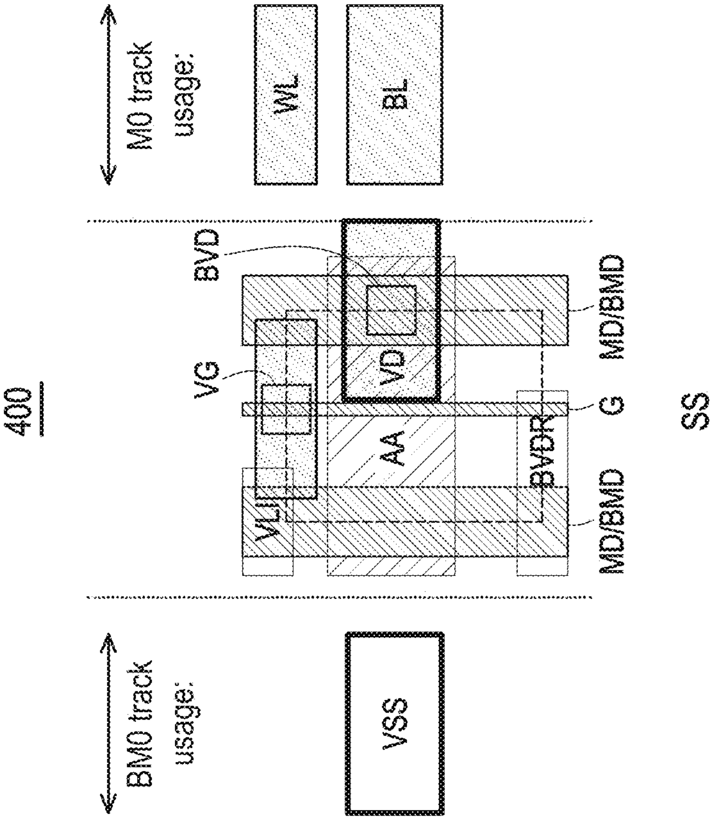
FIGS. 4A and 4B are diagrams of a stacked transistor PUF device, in accordance with some embodiments.
Figure 4A:
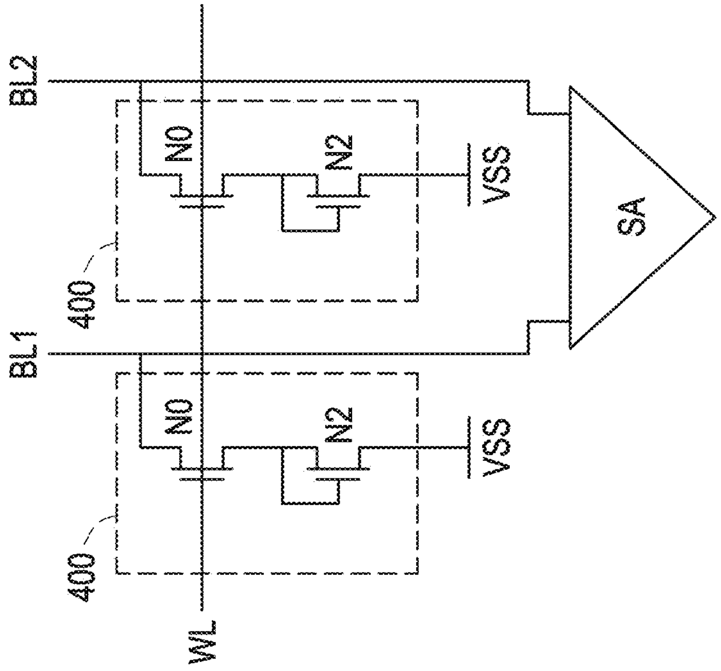

In the embodiment depicted in FIGS. 4A and 4B, each instance of PUF device 400 includes first transistor T0 including n-type transistor N0, and second transistor T1 including an n-type transistor N2 coupled between transistor N0 and the first power supply line configured to have reference voltage VSS. The gate of transistor N2 is electrically connected, through a local interconnect BVDR, to each of the second S/D terminal of transistor N0 and the first S/D terminal of transistor N2.

PUF device 400 thereby includes transistor N2 configured to, in operation, provide a current path between transistor N0 and the first power supply line by being configured as a forward-biased diode based on the voltage on bit line BL and reference voltage VSS.

Figure 5B:
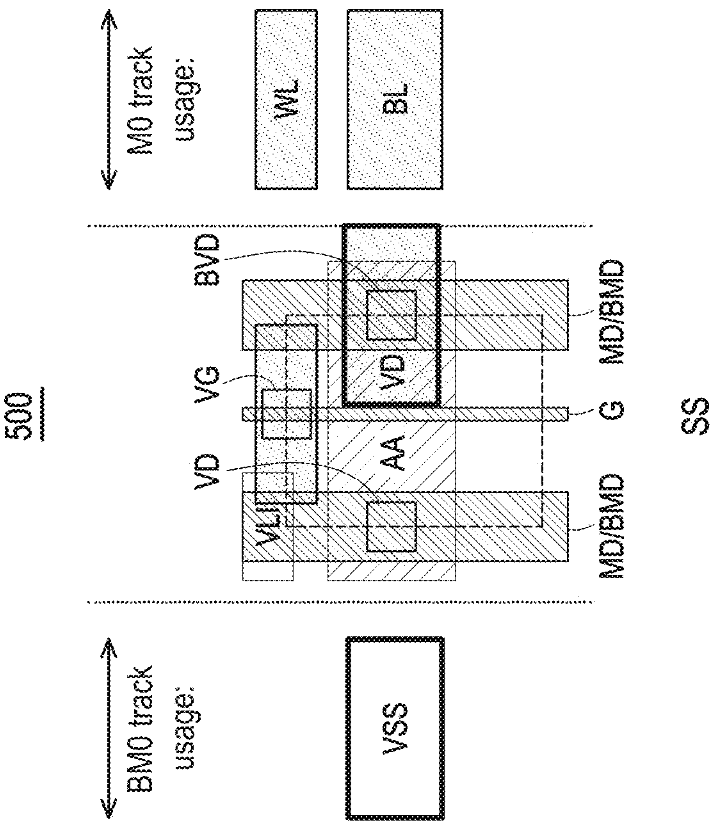
FIGS. 5A and 5B are diagrams of a stacked transistor PUF device, in accordance with some embodiments.
Figure 5A:
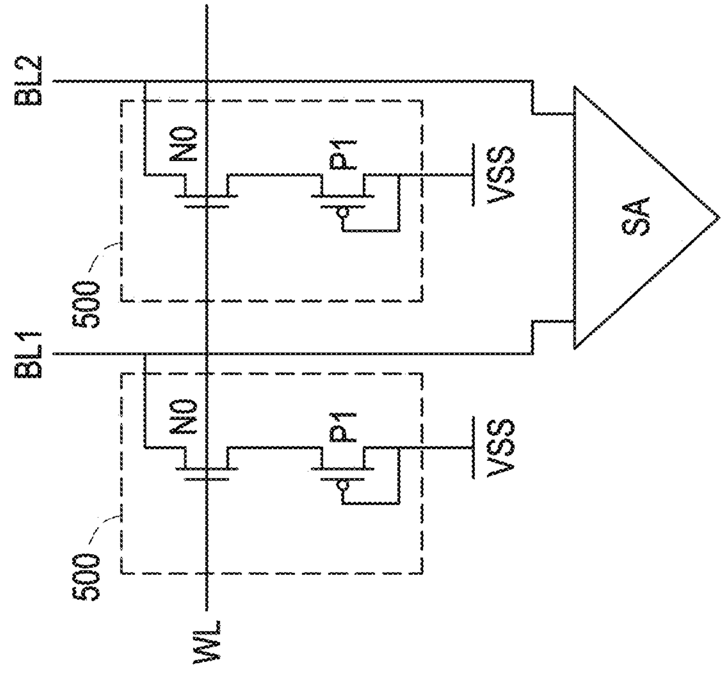

In the embodiment depicted in FIGS. 5A and 5B, each instance of PUF device 500 includes first transistor T0 including n-type transistor N0, and second transistor T1 including a p-type transistor P1 coupled between transistor N0 and the first power supply line configured to have reference voltage VSS. The gate of transistor P1 is electrically connected, through a back side via VD, to the first power supply line and the second S/D terminal of transistor P1.

PUF device 500 thereby includes transistor P1 configured to, in operation, provide a current path between transistor N0 and the first power supply line by being configured as a forward-biased diode based on the voltage on bit line BL and reference voltage VSS.

Figure 6B:
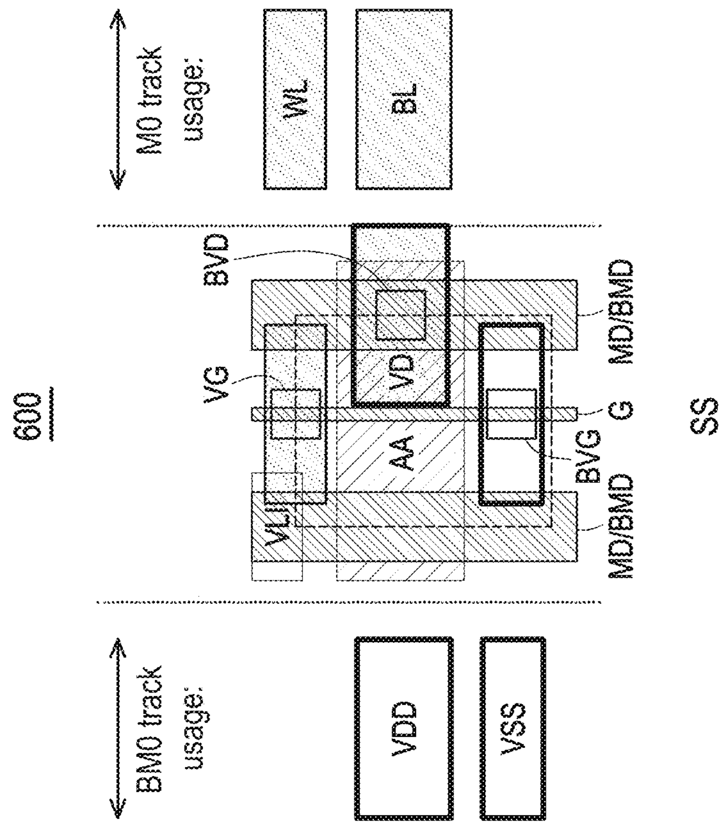
FIGS. 6A and 6B are diagrams of a stacked transistor PUF device, in accordance with some embodiments.
Figure 6A:
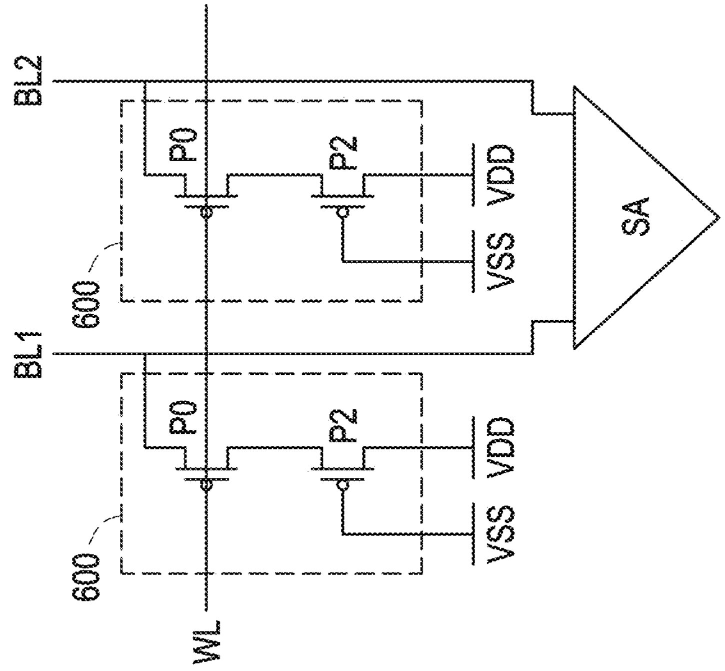

In the embodiment depicted in FIGS. 6A and 6B, each instance of PUF device 600 includes first transistor T0 including p-type transistor P0, and second transistor T1 including a p-type transistor P2 coupled between transistor P0 and the first power supply line configured to have power supply voltage VDD. The gate of transistor P0 is electrically connected, through a back side via BVG, to a second power supply line configured to have reference voltage VSS.

PUF device 600 thereby includes transistor P2 configured to, in operation, provide a current path between transistor P0 and the first power supply line by being switched on responsive to reference voltage VSS and power supply voltage VDD.

In the embodiment depicted in FIGS. 7A and 7B, each instance of PUF device 700 includes first transistor T0 including p-type transistor P0, and second transistor T1 including a p-type transistor P3 coupled between transistor P0 and the first power supply line configured to have power supply level VDD. The gate of transistor P3 is electrically connected, through local interconnect BVDR, to each of the second S/D terminal of transistor P0 and the first S/D terminal of transistor P3.

PUF device 700 thereby includes transistor P3 configured to, in operation, provide a current path between transistor P0 and the first power supply line by being configured as a forward-biased diode based on power supply voltage VDD and the voltage on bit line BL.

In the embodiment depicted in FIGS. 8A and 8B, each instance of PUF device 800 includes first transistor T0 including p-type transistor P0, and second transistor T1 including an n-type transistor N3 coupled between transistor P0 and the first power supply line configured to have power supply voltage VDD. The gate of transistor N3 is electrically connected, through a back side via VD, to the first power supply line and the second S/D terminal of transistor N3.

PUF device 800 thereby includes transistor N3 configured to, in operation, provide a current path between transistor P0 and the first power supply line by being configured as a forward-biased diode based on power supply voltage VDD and the voltage on bit line BL.

By the configurations discussed above, each of PUF devices 300-800 is thereby capable of being included in PUF circuit 100PC as pairs of PUF device 100P, whereby the benefits discussed above with respect to PUF circuit 100PC are capable of being realized.

FIG. 9 is a flowchart of a method 900 of operating a PUF circuit, in accordance with some embodiments. Method 900 is capable of being performed on a PUF circuit, e.g., PUF circuit 100PC discussed above with respect to FIGS. 1-2B.

The sequence in which the operations of method 900 are depicted in FIG. 9 is for illustration only; the operations of method 900 are capable of being executed simultaneously or in sequences that differ from that depicted in FIG. 9. In some embodiments, operations in addition to those depicted in FIG. 9 are performed before, between, during, and/or after the operations depicted in FIG. 9.

At operation 902, first and second bit lines are pre-charged to an initial voltage level. Pre-charging the first and second bit lines to the initial voltage level includes using a pre-charge circuit to drive each of the first and second bit lines to the initial voltage level and subsequently float each of the first and second bit lines during execution of operations 904 and 906 discussed below.

In some embodiments, pre-charging the first and second bit lines to the initial voltage level includes pre-charging the first and second bit lines to a power supply voltage level, e.g., VDD, or a reference voltage level, e.g., VSS.

In some embodiments, pre-charging the first and second bit lines to the initial voltage level includes pre-charging bit lines BL1 and BL2 as discussed above with respect to FIG. 1. In some embodiments, pre-charging the first and second bit lines to the initial voltage level includes pre-charging instances of bit line BL in response to an enable signal, e.g., bit line pre-charge enable signal BLPE, as discussed above with respect to FIGS. 2A and 2B.

At operation 904, a first transistor of each of first and second stacked transistor devices coupled between the first and second bit lines and a power distribution node are simultaneously switched on. Simultaneously switching on the first transistor of each of the first and second stacked transistor devices coupled between the first and second bit lines and the power distribution node includes each of the first and second stacked transistor devices including the first transistor being coupled to the corresponding first or second bit line and including a second transistor coupled between the first transistor and the power distribution node.

In some embodiments, simultaneously switching on the first transistor of each of the first and second stacked transistor devices coupled between the first and second bit lines and the power distribution node includes simultaneously switching on instances of first transistor T0 of each of a pair of PUF devices 100P as discussed above with respect to FIGS. 1-2B.

In some embodiments, simultaneously switching on the first transistor of each of the first and second stacked transistor devices coupled between the first and second bit lines and the power distribution node includes simultaneously switching on instances of transistor N0 as discussed above with respect to FIGS. 3A-5B or simultaneously switching on instances of transistor P0 as discussed above with respect to FIGS. 6A-8B.

In some embodiments, simultaneously switching on the first transistor of each of the first and second stacked transistor devices coupled between the first and second bit lines and the power distribution node includes activating a word line, e.g., a word line WL0-WL2 discussed above with respect to FIG. 1 or word line WL discussed above with respect to FIGS. 2A-8B.

At operation 906, a sense amplifier coupled to the first and second bit lines is used to output a signal indicative of a difference between voltage levels on the first and second bit lines. Using the sense amplifier to output the signal indicative of the difference between voltage levels on the first and second bit lines includes detecting the voltage levels after a predetermined time interval has elapsed after execution of operation 904, e.g., in response to an enable signal such as sense amplifier enable signal SAE discussed above with respect to FIGS. 2A and 2B.

In some embodiments, using the sense amplifier includes using one or more instances of sense amplifier SA discussed above with respect to FIGS. 1-8B.

By executing some or all of the operations of method 900, a unique identifier signal is output based on variations in physical properties of the first and second stacked transistor devices, thereby enabling the realization of the benefits discussed above with respect to PUF circuit 100PC.

FIG. 10A is a schematic perspective view of a stacked transistor device 100A, referred to as device stack 100A in some embodiments, in accordance with some embodiments.

Device stack 100A comprises a stacked structure 10 of a bottom semiconductor device 10L and a top semiconductor device 10U. Bottom semiconductor device 10L is over a substrate. For simplicity, the substrate is not illustrated in FIG. 10A. An example substrate SS is discussed above with respect to FIGS. 3B-8B. Top semiconductor device 10U is physically stacked over the bottom semiconductor device 10L in a thickness direction of the substrate. The thickness direction is designated as a Z axis in FIG. 10A.

In some embodiments, both top semiconductor device 10U and bottom semiconductor device 10L are of a same conductivity type. Conductivity type is sometimes referred to as semiconductor type. Examples of conductivity type include N-type and P-type. In at least one embodiment, e.g., PUF device 300 or 400 discussed above, both top semiconductor device 10U and bottom semiconductor device 10L are N-type semiconductor devices, and stacked structure 10 is referred to as an N-on-N structure. In one or more embodiments, e.g., PUF device 600 or 700 discussed above, both top semiconductor device 10U and bottom semiconductor device 10L are P-type semiconductor devices, and stacked structure 10 is referred to as a P-on-P structure. In one or more embodiments, e.g., PUF device 500 or 800 discussed above, one of top semiconductor device 10U or bottom semiconductor device 10L is a P-type semiconductor device and the other of top semiconductor device 10U or bottom semiconductor device 10L is an N-type semiconductor device.

Examples of semiconductor devices include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In the example configuration in FIG. 10A, the top semiconductor device 10U and bottom semiconductor device 10L are nanosheet FETs. Other semiconductor device configurations are within the scopes of various embodiments. In some embodiments, top semiconductor device 10U and bottom semiconductor device 10L have different semiconductor device configurations. For example, bottom semiconductor device 10L is a planar MOS transistor whereas top semiconductor device 10U is a nanosheet FET.

Top semiconductor device 10U includes a gate 80U, and S/D structures 62U on opposite sides of gate 80U along an X axis. Gate 80U extends, or is elongated, along a Y axis. The X axis, Y axis, Z axis are mutually transverse to each other. In some embodiments, the X axis, Y axis, Z axis are mutually perpendicular to each other. Top semiconductor device 10U further includes a channel region configured by nanosheets 26U which extend along the X axis and connect S/D structures 62U. In the example configuration in FIG. 10A, top semiconductor device 10U includes two nanosheets 26U. Other numbers of nanosheets per transistor are within the scopes of various embodiments. Top semiconductor device 10U includes a gate dielectric layer 78 extending around each of the nanosheets 26U, and electrically isolating gate 80U from nanosheets 26U. Gate 80U extends around gate dielectric layer 78 and nanosheets 26U in a configuration referred to as a gate-all-around (GAA) configuration. Other gate configurations are within the scopes of various embodiments.

Bottom semiconductor device 10L comprises a gate 80L, S/D structures 62L, a channel region configured by nanosheets 26L, and a gate dielectric layer 78 extending around each of nanosheets 26L. Gate 80L, S/D structures 62L, and nanosheets 26L correspond to gate 80U, S/D structures 62U, and nanosheets 26U. Gate 80U, S/D structures 62U, and nanosheets 26U correspondingly overlap the gate 80L, S/D structures 62L, and nanosheets 26L along the Z axis. In the example configuration in FIG. 10A, S/D structures 62U and 62L are epitaxy structures of the same conductivity type. For example, all S/D structures 62U and 62L are P-type epitaxy structures, or all S/D structures 62U and 62L are N-type epitaxy structures.

Stacked structure 10 further includes an intermediate layer 90 between gate 80U and gate 80L. In some embodiments, intermediate layer 90 is a dielectric layer electrically isolating gate 80U from gate 80L, in a configuration referred to as an isolated gate configuration in which gate 80U and gate 80L are controllable independently from each other.

By the configuration discussed above, stacked structure 10 includes one of top semiconductor device 10U or bottom semiconductor device 10L usable as first transistor T0, e.g., transistor N0 or P0, and the other of top semiconductor device 10U or bottom semiconductor device 10L usable as second transistor T1, e.g., transistor N1-N3 or P1-P3, each discussed above with respect to FIGS. 1-8B.

Accordingly, in some embodiments, gates 80U and 80L collectively correspond to gate structure G, nanosheets 26U and 26L collectively correspond to active area AA, and S/D structures 62U and 62L correspond to the S/D terminals of transistors T0, T1, N0-N3 and P0-P3 discussed above with respect to FIGS. 1-8B.

As can be seen from FIG. 10A, in one or more embodiments, the stacking of top semiconductor device 10U over bottom semiconductor device 10L saves about 50% of the required chip area, compared to other approaches without stacking of semiconductor devices.

FIG. 10B is a schematic perspective view, and FIGS. 10C-10F are schematic cross-sectional views, in an X-Z plane, of an IC device 100 at various stages in a manufacturing process, in accordance with some embodiments. IC device 100 includes a plurality of device stacks corresponding to device stack 100A. For simplicity, corresponding components in FIGS. 10A-10F are designated by the same reference numerals. In some embodiments, additional operations are provided before, during, and/or after the manufacturing process described with respect to FIGS. 10B-10F, and/or one or more of the described operations are replaced or eliminated, and or the order of the operations is interchangeable.

Referring to FIG. 10B, the manufacturing process starts from a substrate 20. In at least one embodiment, substrate 20 is a semiconductor substrate. In some embodiments, substrate 20 includes a single crystalline semiconductor layer on at least the surface of substrate 20. Example materials of substrate 20 include, but are not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). For example, substrate 20 is a Si substrate. In some embodiments, substrate 20 is a silicon-on-insulator (SOI) substrate, which includes an insulating layer disposed between two silicon layers. In at least one embodiment, the insulating layer is an oxide layer.

A multilayer structure 22 is formed over substrate 20. In FIG. 10B, multilayer structure 22 is illustrated in a state after formation of fins, as described herein. Multilayer structure 22 includes alternatingly arranged first semiconductor layers 24A, 24B and second semiconductor layers 26U, 26L. Second semiconductor layers 26U, 26L correspond to the nanosheets described with respect to FIG. 10A, and are referred to herein by the same reference numerals of the nanosheets, for simplicity. First semiconductor layers 24A, 24B and second semiconductor layers 26U, 26L include semiconductor materials having different etch selectivity and/or oxidation rates. For example, first semiconductor layers 24A, 24B include SiGe, and second semiconductor layers 26U, 26L include Si. In some embodiments, first and second semiconductor layers 24A, 24B, 26U, 26L are formed by a deposition process, such as epitaxy. For example, epitaxial growth of the layers of multilayer structure 22 is performed by a molecular beam epitaxy (MBE) process, a metalorganic chemical vapor deposition (MOCVD) process, and/or other suitable epitaxial growth processes.

Subsequent to the formation of multilayer structure 22, fins 28 are formed. Each fin 28 comprises a substrate portion 21 of the substrate 20, and a portion 34 of multilayer structure 22. Portion 34 of multilayer structure 22 is sometimes referred to as a stack of semiconductor layers 34. In some embodiments, fins 28 are fabricated using suitable processes, such as double-patterning or multi-patterning processes. For example, in one or more embodiments, a sacrificial layer is formed over a substrate and patterned using a photolithography process. Spacers are formed alongside the patterned sacrificial layer using a self-aligned process. The sacrificial layer is then removed, and the remaining spacers are then used to pattern fins 28 by etching multilayer structure 22 and substrate 20. Example etch processes include, but are not limited to, dry etch, wet etch, reactive ion etch (RIE), and/or other suitable processes. In FIG. 10B, two fins 28 are illustrated; however, the number of fins 28 is not limited to two. Fins 28 extend, or are elongated, along the X axis.

A shallow trench isolation (STI) 32 of an insulating material is formed over substrate 20 and in trenches (not numbered) between fins 28. For example, the insulating material is deposited over substrate 20 and fins 28. Example insulating materials of STI 32 include, but are not limited to, silicon oxide, fluorine-doped silicate glass (FSG), silicon nitride, silicon oxynitride (SiON), SiOCN, SiCN, a low-k dielectric material, or the like. The deposition of the insulating material includes a suitable method, such as low-pressure chemical vapor deposition (LPCVD), plasma enhanced CVD (PECVD) or flowable CVD (FCVD). Then, a planarization operation, such as a chemical mechanical polishing (CMP) process and/or an etch-back process, is performed such that the tops of fins 28 are exposed from the insulating material. A portion of the insulating material between adjacent fins 28 is removed. The remaining portion of the insulating material configures STI 32. The partial removal of the insulating material includes dry etch, wet etch, or the like.

A sacrificial gate dielectric layer 36, a sacrificial gate electrode layer 38, and a mask structure 40 are deposited over STI 32 and fins 28. The sacrificial gate dielectric layer 36 includes one or more layers of dielectric material, such as $SiO_2$, SiN, a high-k dielectric material, and/or other suitable dielectric material. In some embodiments, sacrificial gate dielectric layer 36 is deposited by a CVD process, a sub-atmospheric CVD (SACVD) process, a FCVD process, an atomic layer deposition (ALD) process, a physical vapor deposition (PVD) process, or other suitable process. In at least one embodiment, sacrificial gate electrode layer 38 includes polycrystalline silicon (polysilicon). In some embodiments, mask structure 40 includes a multilayer structure. In some embodiments, sacrificial gate electrode layer 38 and mask structure 40 are formed by one or more processes such as layer deposition, for example, CVD (including both LPCVD and PECVD), PVD, ALD, thermal oxidation, e-beam evaporation, or other suitable deposition techniques. A structure 100B is obtained.

Referring to FIG. 10C, sacrificial gate stacks 42 are formed by one or more pattern and/or etch processes performed on deposited sacrificial gate dielectric layer 36, sacrificial gate electrode layer 38, and mask structure 40 of structure 100B. An example pattern process includes a lithography process. An example etch process includes dry etch (e.g., RIE), wet etch, other etch methods, and/or combinations thereof. Each sacrificial gate stack 42 includes a portion of each of the sacrificial gate dielectric layer 36, sacrificial gate electrode layer 38, and mask structure 40. Sacrificial gate stacks 42 extend, or are elongated, along the Y axis. In FIG. 10C, three sacrificial gate stacks 42 are illustrated; however, the number of sacrificial gate stacks 42 is not limited to three.

Spacers 44 are formed on sidewalls of sacrificial gate stacks 42. For example, spacers 44 are formed by first depositing a conformal layer that is subsequently etched back to form spacers 44. Spacers 44 include a dielectric material, such as silicon oxide, silicon nitride, silicon carbide, silicon oxynitride, SiCN, silicon oxycarbide, SiOCN, and/or combinations thereof. In some embodiments, spacers 44 include multiple layers.

Exposed portions of stacks of semiconductor layers 34 of fins 28 not covered by sacrificial gate stacks 42 and spacers 44 are selectively removed, e.g., by one or more suitable etch processes, such as dry etch, wet etch, or a combination thereof, to form trenches 46. In FIG. 1C, a lowermost one of second semiconductor layers 26U and an uppermost one of second semiconductor layers 26L are designated as middle second semiconductor layers 26M which sandwich therebetween a middle first semiconductor layer 24B. Middle second semiconductor layers 26M and middle first semiconductor layer 24B are not configured to form channel regions of the top semiconductor device 10U and bottom semiconductor device 10L. Edge portions of first semiconductor layers 24A, 24B and second semiconductor layers 26U, 26L, 26M are exposed in trenches 46. Trenches 46 also expose portions of substrate portion 21. A structure 100C is obtained.

Referring to FIG. 10D, exposed edge portions of the first semiconductor layers 24A are removed. In some embodiments, the removal includes a selective wet etch process. The selective wet etch process further completely (or substantially completely) removes first semiconductor layer 24B in the middle of stack of semiconductor layers 34. For example, in embodiments where first semiconductor layers 24A, 24B include SiGe, and second semiconductor layers 26U, 26L, 26M include Si, a selective wet etch is configured to etch first semiconductor layer 24B at a highest etch rate, first semiconductor layers 24A at a second highest etch rate, and second semiconductor layers 26U, 26L, 26M at a slowest etch rate. As a result, the exposed edge portions of the first semiconductor layers 24A and an entirety (or substantially an entirety) of first semiconductor layer 24B are removed, whereas second semiconductor layers 26U, 26L, 26M are substantially unchanged.

A dielectric material is deposited over and into the spaces created by the removal of first semiconductor layer 24B and the partial removal of the edge portions of first semiconductor layers 24A. The dielectric material filling in the spaces created by the partial removal of the edge portions of first semiconductor layers 24A configures inner spacers 54. The dielectric material filling in the space created by the removal of first semiconductor layer 24B configures an inner isolation structure 56. Examples of the dielectric material forming inner spacers 54 and inner isolation structure 56 include, but are not limited to, a low-k dielectric material, such as $SiO_2$, SiN, SiCN, SiOC, or SiOCN, or a high-k dielectric material, such as $HfO_2$, ZrOx, ZrAlOx, HfAlOx, HfSiOx, AlOx, or other suitable dielectric material. In some embodiments, inner spacers 54 and inner isolation structure 56 include different dielectric materials. In an example process, inner spacers 54 and inner isolation structure 56 are formed by depositing a conformal layer of the dielectric material, using a conformal deposition process, such as ALD, followed by an anisotropic etching to remove portions of the conformal layer other than inner spacers 54 and inner isolation structure 56.

S/D structures 62L are formed over, and in contact with, the exposed portions of substrate portions 21, and exposed edge portions of second semiconductor layers 26L. In the example configuration in FIG. 10D, S/D structures 62L include epitaxy structures and are sometimes referred to as S/D epitaxy structures 62L. In some embodiments, S/D epitaxy structures 62L include one or more layers of Si, SiP, SiC and SiCP to configure an N-type bottom semiconductor device. In some embodiments, S/D epitaxy structures 62L include one or more layers of Si, SiGe, Ge to configure a P-type bottom semiconductor device. Example epitaxial growth processes for growing S/D epitaxy structures 62L include, but are not limited to, CVD, ALD, MBE. In some embodiments, S/D epitaxy structures 62L are grown to a height above uppermost second semiconductor layer 26L, and then top portions of S/D epitaxy structures 62L are partially removed, e.g., by a dry etch or wet etch, so that upper surfaces of the remaining S/D epitaxy structures 62L are at a level of uppermost first semiconductor layer 24A immediately under lower middle second semiconductor layer 26M, as illustrated in FIG. 10D.

A liner 63 is formed at least over the upper surfaces of S/D epitaxy structures 62L, and exposed side faces of middle second semiconductor layers 26M, inner isolation structure 56. In some embodiments, liner 63 includes Si. In an example process, liner 63 is a conformal layer formed by a conformal process, such as an ALD process.

A dielectric material 68 is formed over liner 63 and over S/D epitaxy structures 62L. In some embodiments, dielectric material 68 includes the same material as STI 32 and/or is formed by the same method as STI 32. Liner 63 and dielectric material 68 are removed outside trenches 46, and partially removed inside trenches 46, e.g., by a dry etch or wet etch. As a result, upper surfaces of liner 63 and dielectric material 68 are at a level of lowermost first semiconductor layer 24A immediately above upper middle second semiconductor layer 26M, as illustrated in FIG. 10D. Liner 63 and dielectric material 68 configure an isolation structure between S/D structure 62L and S/D structures 62U to be subsequently formed thereover.

S/D structures 62U are formed over, and in contact with, the upper surfaces of liner 63 and dielectric material 68, and exposed edge portions of second semiconductor layers 26U. In the example configuration in FIG. 10D, S/D structures 62U include epitaxy structures and are sometimes referred to as S/D epitaxy structures 62U. In some embodiments, S/D epitaxy structures 62U are of the same or opposite conductivity type as S/D epitaxy structures 62L. In some embodiments, S/D epitaxy structures 62U include the same material and/or are manufactured by the same manufacturing processes as S/D epitaxy structures 62L. In at least one embodiment, S/D epitaxy structures 62U have the same configuration, e.g., the same size, shape, height, material, as S/D epitaxy structures 62L. In an example, where S/D epitaxy structures 62L include one or more layers of Si, SiP, SiC and SiCP to configure an N-type bottom semiconductor device, S/D epitaxy structures 62U include one or more layers of Si, SiP, SiC and SiCP to configure an N-type top semiconductor device. In another example, where S/D epitaxy structures 62L include one or more layers of Si, SiGe, Ge to configure a P-type bottom semiconductor device, S/D epitaxy structures 62U include one or more layers of Si, SiGe, Ge to configure a P-type top semiconductor device. In some embodiments, S/D epitaxy structures 62U are grown to a height above sacrificial gate dielectric layer 36, and then top portions of S/D epitaxy structures 62U are partially removed, e.g., by a dry etch or wet etch, so that upper surfaces of the remaining S/D epitaxy structures 62U are at a level of sacrificial gate dielectric layer 36, as illustrated in FIG. 10D. This is an example, and a height of S/D epitaxy structures 62U is controllable depending on application and/or process requirements.

A contact etch stop layer (CESL) 70 is formed over S/D epitaxy structures 62U. Example materials of CESL 70 include, but are not limited to, silicon nitride, silicon carbon nitride, silicon oxynitride, carbon nitride, silicon oxide, silicon carbon oxide, the like, or a combination thereof. CESL 70 is formed by CVD, PECVD, ALD, or any suitable deposition technique.

An interlayer dielectric (ILD) layer 72 is formed over CESL 70. Example materials of ILD layer 72 include, but are not limited to, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. ILD layer 72 is deposited by a PECVD process or other suitable deposition technique. A structure 100D is obtained.

Referring to FIG. 10E, a planarization process, such as a CMP process, is performed to remove mask structure 40 and expose sacrificial gate electrode layer 38. The planarization process also removes portions of ILD layer 72 and CESL 70.

Exposed sacrificial gate electrode layer 38 and sacrificial gate dielectric layer 36 are removed, e.g., by one or more suitable processes, such as dry etch, wet etch, or a combination thereof.

Next, first semiconductor layers 24A are removed, e.g., by any suitable processes, such as dry etch, wet etch, or a combination thereof. The removal of first semiconductor layers 24A exposes inner spacers 54 and second semiconductor layers 26U, 26L, and creates spaces between and around exposed portions of second semiconductor layers 26U, 26L not covered by inner spacers 54. The exposed portions of second semiconductor layers 26U, 26L configure nanosheets 26U, 26L described with respect to FIG. 10A. Middle second semiconductor layers 26M and inner isolation structure 56 are covered by liner 63 and dielectric material 68, and are substantially unaffected by the removal of first semiconductor layers 24A.

A gate dielectric layer 78 is formed over and around each of nanosheets 26U, 26L. In some embodiments, gate dielectric layer 78 comprises the same material as sacrificial gate dielectric layer 36. In some embodiments, gate dielectric layer 78 comprises a high-k dielectric material. In some embodiments, the gate dielectric layer 78 is formed by a conformal process, such as an ALD process.

A gate electrode material is formed over and around gate dielectric layers 78 and nanosheets 26U, 26L. The gate electrode material surrounding each of nanosheets 26U configures gate 80U. The gate electrode material surrounding each of nanosheets 26L configures gate 80L. In some embodiments, the gate electrode material comprises multiple gate electrode layers. Example gate electrode materials include, but are not limited to, polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode material includes a P-type gate electrode layer, such as TiN, TaN, TiTaN, TiAlN, WCN, W, Ni, Co, or other suitable material, for configuring P-type top and bottom semiconductor devices. In at least one embodiment, the gate electrode material includes an N-type gate electrode layer, such as TiAlC, TaAlC, TiSiAlC, TiC, TaSiAlC, or other suitable material, for configuring N-type top and bottom semiconductor devices. Example processes for depositing the gate electrode material include, but are not limited to, PVD, CVD, ALD, electro-plating, or other suitable methods.

In some embodiments, each of gate 80U and gate 80L includes a corresponding GAA structure, and gates 80U and 80L are physically and electrically separated from each other by middle second semiconductor layers 26M and inner isolation structure 56. In some embodiments, a combination of middle second semiconductor layers 26M and inner isolation structure 56 corresponds to intermediate layer 90 being a dielectric material in an isolated gate configuration. The formation of gates 80U and 80L completes the formation of top semiconductor device 10U and bottom semiconductor device 10L.

An ILD layer 92 similar to ILD layer 72 is deposited over gate 80U, and a planarization process, such as a CMP, is performed. A structure 100E is obtained.

Referring to FIG. 10F, openings are formed in ILD layer 72 to expose S/D epitaxy structures 62U. A silicide layer 94 is formed over the exposed S/D epitaxy structures 62U, and then S/D contacts 96U are formed in each opening and over silicide layer 94. S/D contacts are sometimes referred to as MD contacts. S/D contacts of top semiconductor devices, e.g., MD segments MD discussed above with respect to FIGS. 3B-8B, are sometimes referred to as MD contacts. S/D contacts of bottom semiconductor devices, e.g., MD segments BMD discussed above with respect to FIGS. 3B-8B, are sometimes referred to as BMD contacts. For simplicity, an MD contact herein refers to either an MD contact at the upper layer or a BMD contact at the lower layer, unless specified otherwise. Example materials of S/D contacts 96U include, but are not limited to, Ru, Mo, Co, Ni. W, Ti, Ta, Cu, Al, TiN and TaN. S/D contacts 96U are formed by any suitable process, such as PVD, ECP, or CVD.

Dielectric layers 104, 106 are deposited over MD contacts 96U and ILD layer 92. Various vias 108, 110 are formed by etching via openings in dielectric layers 104, 106 and ILD layer 92, and then filling the via openings with a conductive material, such as a metal. A via over and in electrical contact with an MD contact is sometimes referred to as via-to-device (VD) via. A via over and in electrical contact with a gate is sometimes referred to as via-to-gate (VG) via. In the example configuration in FIG. 10F, via 108 is a VG via which is over gate 80U, and vias 110 are VD vias correspondingly over MD contacts 96U. VG and VD vias for bottom semiconductor devices are sometimes correspondingly referred to as BVG and BVD vias.

In some embodiments, the formation of VG, VD vias completes a front-end-of-line (FEOL) fabrication. A resulting FEOL structure 112 comprising various semiconductor devices formed over a front side (or upper side) of substrate 20 and the corresponding MD contacts, VG and VD vias is obtained. The FEOL fabrication is followed by a Back End of Line (BEOL) fabrication to provide routing for the semiconductor devices, e.g., routing of bit lines BL1 and BL2 and word lines WL and WL0-WL2 discussed above with respect to FIGS. 1-8B.

The BEOL fabrication comprises forming a redistribution structure 114 over VD, VG vias 108, 110. Redistribution structure 114 includes a plurality of metal layers 118A-118C and via layers 117A, 117B sequentially and alternatingly formed over VD, VG vias 108, 110. Redistribution structure 114 further includes various interlayer dielectric (ILD) layers 116 in which the metal layers and via layers are embedded. The metal layers and via layers of redistribution structure 114 are configured to electrically couple various semiconductor devices, or circuits of IC device 100 with each other, and/or with external circuitry. In redistribution structure 114, the lowermost metal layer 118A immediately over and in electrical contact with VD, VG vias 108, 110 is a M0 (metal-zero) layer, a next metal layer 118B immediately over the M0 layer is an M1 layer, a next metal layer 118C immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couples the Mn layer and the Mn+1 layer, where n is an integer from zero and up. For example, via layer 117A is a via-zero (V0) layer which is the lowermost via layer arranged between and electrically coupling M0 layer 118A and M1 layer 118B. The next via layer 117B is a V1 layer which is the via layer arranged between and electrically coupling M1 layer 118B and M2 layer 118C. Vias in the V0 layer are referred to as V0 vias, vias in the V1 layer are referred to as V1 vias, or the like. For simplicity, metal layers and via layers in redistribution structure 114 are not fully illustrated in FIG. 10F. Redistribution structure 114 and interconnects therein are formed over the front side of the substrate 20, and are sometimes referred to as the front side redistribution structure and front side interconnects. A structure 100F is obtained, as illustrated in FIG. 10F.

In some embodiments, the BEOL fabrication of IC device 100 further includes forming a back side redistribution structure (not shown) and corresponding back side interconnects on the back side (e.g., the lower side in FIG. 10F) of substrate 20. An example back side redistribution structure includes one or both of power supply line VDD or power supply line VSS discussed above with respect to FIGS. 1-8B. In an example manufacturing process, structure 100F is flipped over and temporarily bonded to a carrier (not shown). Wafer thinning is performed from the back side (now facing upward) to remove a portion of substrate 20. For example, as illustrated in FIG. 10F, a substrate portion 130 of substrate 20 remains as a result of the wafer thinning on the back side. In some embodiments, the wafer thinning process includes a grinding operation, a polishing operation (such as, chemical mechanical polishing (CMP)), or the like. In at least one embodiment, substrate 20 is completely removed, and a new substrate (not shown), e.g., an insulation substrate, is formed over bottom semiconductor device 10L.

A back side redistribution structure is formed, in a manner similar to that of forming redistribution structure 114, over the remaining substrate portion 130 or the new substrate. The back side redistribution structure comprises various back side metal layers and various back side via layers arranged alternatingly in the thickness direction, i.e., along the Z axis. The back side redistribution structure further comprises various interlayer dielectric (ILD) layers in which the back side metal layers and back side via layers are embedded. The back side metal layer immediately adjacent the bottom semiconductor device 10L is a back side M0 (BM0) layer, a next back side metal layer is a back side M1 (BM1) layer, or the like. A back side via layer BVn is arranged between and electrically couples the BMn layer and the BMn+1 layer, where n is an integer from zero and up. For example, a via layer BV0 is the back side via layer arranged between and electrically coupling the BM0 layer and the BM1 layer. Other back side via layers are BV1, BV2, or the like. Conductive patterns in the BM0 layer are referred to as BM0 conductive patterns, conductive patterns in the BM1 layer are referred to as BM1 conductive patterns, or the like. Vias in the BV0 layer are referred to as BV0 vias, vias in the BV1 layer are referred to as BV1 vias, or the like.

In at least one embodiment, one or more advantages described herein are achievable by IC devices comprising device stacks described with respect to FIG. 10A, and/or IC devices manufactured by processes described with respect to FIGS. 10B-10F. Although the described manufacturing processes include formation of nanosheet devices in one or more embodiments, other types of devices, e.g., nanowire, FinFET, planar, or the like, are within the scopes of various embodiments. The described manufacturing processes and/or orders of operations are examples. Other manufacturing processes and/or orders of operations are within the scopes of various embodiments.

Various electrical connections between the top semiconductor device 10U and the bottom semiconductor device 10L, and/or between one or more of top semiconductor device 10U or bottom semiconductor device 10L and circuit elements outside device stack 100A are within the scopes of some embodiments. Several example electrical connections are described above with respect to FIGS. 3B-8B.

FIG. 11 is a flowchart of a method 1100 of forming a stacked transistor PUF device, e.g., a pair of PUF devices 100P discussed above with respect to FIGS. 1-2B or PUF devices 300-800 discussed above with respect to FIGS. 3A-8B, in accordance with some embodiments.

FIGS. 10A-10F are diagrams of IC device 100 including a pair of device stacks 100A, usable as PUF devices 100P and 300-800, at various manufacturing stages corresponding to the operations of method 1100, in accordance with some embodiments. Some or all of the operations of method 1100 discussed below are implemented by executing some or all of the manufacturing procedures discussed above with respect to FIGS. 10A-10F.

The sequence in which the operations of method 1100 are depicted in FIG. 11 is for illustration only; the operations of method 1100 are capable of being executed simultaneously or in sequences that differ from that depicted in FIG. 11. In some embodiments, operations in addition to those depicted in FIG. 11 are performed before, between, during, and/or after the operations depicted in FIG. 11.

At operation 1102, first and second stacked transistor devices are constructed, each of the first and second stacked transistor devices including top and bottom transistors connected in series. In some embodiments, constructing the first and second stacked transistor devices includes performing operations in accordance with the discussion above with respect to FIGS. 10A-10E.

Constructing the top and bottom transistors of each of the first and second stacked transistor devices, the top and bottom transistors being connected in series includes forming separately controllable first and second gates, the first gate being included in the top transistor and overlying the second gate included in the bottom transistor, and forming an interconnect structure electrically connecting a S/D structure of the top transistor to a S/D structure of the bottom transistor.

In some embodiments, constructing the first and second stacked transistor devices includes constructing instances of stacked transistor PUF device 100P discussed above with respect to FIGS. 1-2B.

In some embodiments, constructing the first and second stacked transistor devices includes constructing instances of one of stacked transistor PUF devices 300-800 discussed above with respect to FIGS. 3A-8B.

In some embodiments, constructing the first and second stacked transistor devices includes constructing a first one of the top or bottom transistors as an n-type GAA transistor and a second one of the top or bottom transistors as a p-type GAA transistor or constructing both of the top and bottom transistors as n-type GAA transistors or p-type GAA transistors.

At operation 1104, a first front side via is formed on a first S/D structure of the top transistor of the first stacked transistor device, a second via is formed on a first S/D structure of the top transistor of the second stacked transistor device, a third front side via is formed on a gate of the top transistor of the first stacked transistor device, and a fourth front side via is formed on a gate of the top transistor of the second stacked transistor device.

In some embodiments, forming the first through fourth vias includes performing operations in accordance with the discussion above with respect to FIGS. 10A-10F.

In some embodiments, forming the first and second front side vias includes forming electrical connections on instances of a S/D terminal of transistor T0 of stacked transistor PUF device 100P discussed above with respect to FIGS. 1-2B.

In some embodiments, forming the first and second front side vias includes forming electrical connections on instances of a S/D terminal of transistor N0 or P0 of one of stacked transistor PUF devices 300-800 discussed above with respect to FIGS. 3A-8B.

In some embodiments, forming the third and fourth front side vias includes forming electrical connections on instances of a gate of transistor T0 of stacked transistor PUF device 100P discussed above with respect to FIGS. 1-2B.

In some embodiments, forming the third and fourth front side vias includes forming electrical connections on instances of a gate of transistor N0 or P0 of one of stacked transistor PUF devices 300-800 discussed above with respect to FIGS. 3A-8B.

At operation 1106, a first bit line is formed on the first front side via, a second bit line is formed on the second front side via, and a word line is formed on each of the third and fourth front side vias.

In some embodiments, forming the first and second bit lines and word line includes performing operations in accordance with the discussion above with respect to FIGS. 10A-10F.

In some embodiments, forming the first and second bit lines and word line includes forming bit lines BL1 and BL2 and word line WL0-WL2 or WL discussed above with respect to FIGS. 1-8B.

At operation 1108, a first back side via is formed on a first S/D structure of the bottom transistor of the first stacked transistor device and a second back side via is formed on a first S/D structure of the bottom transistor of the second stacked transistor device.

In some embodiments, forming the first and second back side vias includes performing operations in accordance with the discussion above with respect to FIGS. 10A-10F.

In some embodiments, forming the first and second back side vias includes forming electrical connections on instances of a S/D terminal of transistor T1 of stacked transistor PUF device 100P discussed above with respect to FIGS. 1-2B.

In some embodiments, forming the first and second back side vias includes forming electrical connections on instances of a S/D terminal of transistor N1-N3 or P1-P3 of one of stacked transistor PUF devices 300-800 discussed above with respect to FIGS. 3A-8B.

In some embodiments, forming the first and second back side vias includes forming a third back side via on a gate of the bottom transistor of the first stacked transistor device and a fourth back side via on a gate of the bottom transistor of the second stacked transistor device.

In some embodiments, forming the third and fourth back side vias includes forming electrical connections on instances of a gate of transistor T1 of stacked transistor PUF device 100P discussed above with respect to FIGS. 1-2B.

In some embodiments, forming the third and fourth back side vias includes forming electrical connections on instances of a gate of transistor N1, N3, P1, or P3 of one of stacked transistor PUF devices 300, 500, 600, or 800 discussed above with respect to FIGS. 3A, 3B, 5A, 5B, 6A, 6B, 8A, and 8B.

At operation 1110, a first power supply line is formed on each of the first and second back side vias.

In some embodiments, forming the first power supply line includes performing operations in accordance with the discussion above with respect to FIGS. 10A-10F.

In some embodiments, forming the first power supply line includes forming first power distribution node NP discussed above with respect to FIGS. 1-8B.

In some embodiments, forming the first power supply line includes the first power supply line being configured to have one of a power supply voltage, e.g., VDD, or a reference voltage, e.g., VSS, as discussed above with respect to FIGS. 1-8B.

In some embodiments, forming the first power supply line includes forming a second power supply line on each of the third and fourth back side vias.

In some embodiments, forming the first and second power supply lines includes forming the first power supply line being configured to have one of the power supply voltage or the reference voltage and forming the second power supply line being configured to have the other of the power supply voltage or the reference voltage, as discussed above with respect to FIGS. 1-8B.

The operations of method 1100 are usable to form stacked transistor PUF device capable of outputting a unique identifier signal based on variations in physical properties of the first and second stacked transistor devices, thereby enabling the realization of the benefits discussed above with respect to PUF circuit 100PC.

In some embodiments, an IC device includes a first stacked transistor structure including first and second transistors positioned in a semiconductor substrate, a second stacked transistor structure including third and fourth transistors positioned in the semiconductor substrate, first and second bit lines and a word line positioned on one of a front or back side of the semiconductor substrate, and a first power supply line positioned on the other of the front or back side of the semiconductor substrate. The first transistor includes a first source/drain (S/D) terminal electrically connected to the first bit line, a second S/D terminal electrically connected to a first S/D terminal of the second transistor, and a gate electrically connected to the word line, the third transistor includes a first S/D terminal electrically connected to the second bit line, a second S/D terminal electrically connected to a first S/D terminal of the fourth transistor, and a gate electrically connected to the word line, and each of the second and fourth transistors includes a second S/D terminal electrically connected to the first power supply line. In some embodiments, the first bit line is electrically connected to a first input terminal of a sense amplifier and the second bit line is electrically connected to a second input terminal of the sense amplifier. In some embodiments, the first and second bit lines and the word line are positioned on the front side of the semiconductor substrate, the first power supply line is positioned on the back side of the semiconductor substrate, each electrical connection from the first and third transistors to the first and second bit lines and the word line includes a front side via, and each electrical connection from the second and third transistors to the first power supply line includes a back side via. In some embodiments, the first stacked transistor structure includes a first local interconnect positioned between and electrically connecting the second S/D terminal of the first transistor and the first S/D terminal of the second transistor, and the second stacked transistor structure includes a second local interconnect positioned between and electrically connecting the second S/D terminal of the third transistor and the first S/D terminal of the fourth transistor. In some embodiments, the first power supply line is configured to have a reference voltage level, each of the first through fourth transistors includes an n-type transistor, and the IC device includes a second power supply line positioned on the other of the front or back side of the semiconductor substrate and configured to have a power supply voltage level, and each of the second and fourth transistors includes a gate electrically connected to the second power supply line. In some embodiments, the first power supply line is configured to have a reference voltage level, each of the first through fourth transistors includes an n-type transistor, the first stacked transistor structure includes a first local interconnect configured to electrically connect a gate of the second transistor to the second S/D terminal of the first transistor and the first S/D terminal of the second transistor, and the second stacked transistor structure includes a second local interconnect configured to electrically connect a gate of the fourth transistor to the second S/D terminal of the third transistor and the first S/D terminal of the fourth transistor. In some embodiments, the first power supply line is configured to have a reference voltage level, each of the first and third transistors includes an n-type transistor, each of the second and fourth transistors includes a p-type transistor, and each of the second and fourth transistors includes a gate electrically connected to the first power supply line. In some embodiments, the first power supply line is configured to have a power supply voltage level, each of the first through fourth transistors includes a p-type transistor, the IC device includes a second power supply line positioned on the other of the front or back side of the semiconductor substrate and configured to have a reference voltage level, and each of the second and fourth transistors includes a gate electrically connected to the second power supply line. In some embodiments, the first power supply line is configured to have a power supply voltage level, each of the first through fourth transistors includes a p-type transistor, the first stacked transistor structure includes a first local interconnect configured to electrically connect a gate of the second transistor to the second S/D terminal of the first transistor and the first S/D terminal of the second transistor, and the second stacked transistor structure includes a second local interconnect configured to electrically connect a gate of the fourth transistor to the second S/D terminal of the third transistor and the first S/D terminal of the fourth transistor. In some embodiments, the first power supply line is configured to have a power supply voltage level, each of the first and third transistors includes a p-type transistor, each of the second and fourth transistors includes an n-type transistor, and each of the second and fourth transistors includes a gate electrically connected to the first power supply line.

In some embodiments, a PUF circuit includes a sense amplifier, first and second bit lines coupled to input terminals of the sense amplifier, a plurality of word lines, a power distribution node, and a column of PUF device pairs, wherein each PUF device pair includes a first stacked transistor structure including first and second transistors coupled in series between the first bit line and the power distribution node, a second stacked transistor structure including third and fourth transistors coupled in series between the second bit line and the power distribution node, and gates of the first and third transistors coupled to a corresponding word line of the plurality of word lines. In some embodiments, the power distribution node includes a reference voltage node, the PUF circuit includes a power supply voltage node, each of the first through fourth transistors of each PUF device pair includes an n-type transistor, and gates of the second and fourth transistors of each PUF device pair are coupled to the power supply voltage node. In some embodiments, the power distribution node includes a reference voltage node, each of the first and third transistors of each PUF device pair includes an n-type transistor, the second transistor of each PUF device pair is configured as a diode coupled between the corresponding first transistor and the reference voltage node, and the fourth transistor of each PUF device pair is configured as a diode coupled between the corresponding third transistor and the reference voltage node. In some embodiments, the power distribution node includes a power supply voltage node, the PUF circuit includes a reference voltage node, each of the first through fourth transistors of each PUF device pair includes a p-type transistor, and gates of the second and fourth transistors of each PUF device pair are coupled to the reference voltage node. In some embodiments, the power distribution node includes a power supply voltage node, each of the first and third transistors of each PUF device pair includes a p-type transistor, the second transistor of each PUF device pair is configured as a diode coupled between the corresponding first transistor and the power supply voltage node, and the fourth transistor of each PUF device pair is configured as a diode coupled between the corresponding third transistor and the power supply voltage node.

In some embodiments, a method of manufacturing a stacked transistor PUF device includes constructing first and second stacked transistor devices, each of the first and second stacked transistor devices including top and bottom transistors connected in series, forming a first front side via on a first source/drain (S/D) structure of the top transistor of the first stacked transistor device, a second front side via on a first S/D structure of the top transistor of the second stacked transistor device, a third front side via on a gate of the top transistor of the first stacked transistor device, and a fourth front side via on a gate of the top transistor of the second stacked transistor device, forming a first bit line on the first front side via, a second bit line on the second front side via, and a word line on each of the third and fourth front side vias, forming a first back side via on a first S/D structure of the bottom transistor of the first stacked transistor device and a second back side via on a first S/D structure of the bottom transistor of the second stacked transistor device, and forming a first power supply line on each of the first and second back side vias. In some embodiments, constructing the top and bottom transistors of each of the first and second stacked transistor devices includes forming separately controllable first and second gates, the first gate being included in the top transistor and overlying the second gate included in the bottom transistor, and forming an interconnect structure electrically connecting a second S/D structure of the top transistor to a second S/D structure of the bottom transistor. In some embodiments, the method includes forming a third back side via on a gate of the bottom transistor of the first stacked transistor device and a fourth back side via on a gate of the bottom transistor of the second stacked transistor device, and forming a second power supply line on each of the third and fourth back side vias. In some embodiments, constructing the top and bottom transistors of each of the first and second stacked transistor devices includes constructing a first one of the top or bottom transistors as an n-type GAA transistor and a second one of the top or bottom transistors as a p-type GAA transistor. In some embodiments, constructing the top and bottom transistors of each of the first and second stacked transistor devices includes constructing both of the top and bottom transistors as n-type GAA transistors or p-type GAA transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device comprising:

a first stacked transistor structure comprising first and second transistors positioned in a semiconductor substrate;

a second stacked transistor structure comprising third and fourth transistors positioned in the semiconductor substrate;

first and second bit lines and a word line positioned on one of a front or back side of the semiconductor substrate; and a first power supply line positioned on the other of the front or back side of the semiconductor substrate, wherein the first transistor comprises a first source/drain (S/D) terminal electrically connected to the first bit line, a second S/D terminal electrically connected to a first S/D terminal of the second transistor, and a gate electrically connected to the word line, the third transistor comprises a first S/D terminal electrically connected to the second bit line, a second S/D terminal electrically connected to a first S/D terminal of the fourth transistor, and a gate electrically connected to the word line, and each of the second and fourth transistors comprises a second S/D terminal electrically connected to the first power supply line.

2. The IC device of claim 1, wherein the first bit line is electrically connected to a first input terminal of a sense amplifier, and the second bit line is electrically connected to a second input terminal of the sense amplifier.

3. The IC device of claim 1, wherein the first and second bit lines and the word line are positioned on the front side of the semiconductor substrate, the first power supply line is positioned on the back side of the semiconductor substrate, each electrical connection from the first and third transistors to the first and second bit lines and the word line comprises a front side via, and each electrical connection from the second and third transistors to the first power supply line comprises a back side via.

4. The IC device of claim 1, wherein the first stacked transistor structure further comprises a first local interconnect positioned between and electrically connecting the second S/D terminal of the first transistor and the first S/D terminal of the second transistor, and the second stacked transistor structure further comprises a second local interconnect positioned between and electrically connecting the second S/D terminal of the third transistor and the first S/D terminal of the fourth transistor.

5. The IC device of claim 1, wherein the first power supply line is configured to have a reference voltage level, each of the first through fourth transistors comprises an n-type transistor, and the IC device further comprises a second power supply line positioned on the other of the front or back side of the semiconductor substrate and configured to have a power supply voltage level, and each of the second and fourth transistors further comprises a gate electrically connected to the second power supply line.

6. The IC device of claim 1, wherein the first power supply line is configured to have a reference voltage level, each of the first through fourth transistors comprises an n-type transistor, the first stacked transistor structure further comprises a first local interconnect configured to electrically connect a gate of the second transistor to the second S/D terminal of the first transistor and the first S/D terminal of the second transistor, and the second stacked transistor structure further comprises a second local interconnect configured to electrically connect a gate of the fourth transistor to the second S/D terminal of the third transistor and the first S/D terminal of the fourth transistor.

7. The IC device of claim 1, wherein the first power supply line is configured to have a reference voltage level, each of the first and third transistors comprises an n-type transistor, each of the second and fourth transistors comprises a p-type transistor, and each of the second and fourth transistors further comprises a gate electrically connected to the first power supply line.

8. The IC device of claim 1, wherein the first power supply line is configured to have a power supply voltage level, each of the first through fourth transistors comprises a p-type transistor, the IC device further comprises a second power supply line positioned on the other of the front or back side of the semiconductor substrate and configured to have a reference voltage level, and each of the second and fourth transistors further comprises a gate electrically connected to the second power supply line.

9. The IC device of claim 1, wherein the first power supply line is configured to have a power supply voltage level, each of the first through fourth transistors comprises a p-type transistor, the first stacked transistor structure further comprises a first local interconnect configured to electrically connect a gate of the second transistor to the second S/D terminal of the first transistor and the first S/D terminal of the second transistor, and the second stacked transistor structure further comprises a second local interconnect configured to electrically connect a gate of the fourth transistor to the second S/D terminal of the third transistor and the first S/D terminal of the fourth transistor.

10. The IC device of claim 1, wherein the first power supply line is configured to have a power supply voltage level, each of the first and third transistors comprises a p-type transistor, each of the second and fourth transistors comprises an n-type transistor, and each of the second and fourth transistors further comprises a gate electrically connected to the first power supply line.

11. A physically unclonable function (PUF) circuit, comprising:

a sense amplifier;

first and second bit lines coupled to input terminals of the sense amplifier;

a plurality of word lines;

a power distribution node; and a column of PUF device pairs, wherein each PUF device pair comprises:

a first stacked transistor structure comprising first and second transistors coupled in series between the first bit line and the power distribution node;

a second stacked transistor structure comprising third and fourth transistors coupled in series between the second bit line and the power distribution node; and gates of the first and third transistors coupled to a corresponding word line of the plurality of word lines.

12. The PUF circuit of claim 11, wherein the power distribution node comprises a reference voltage node, the PUF circuit further comprises a power supply voltage node, each of the first through fourth transistors of each PUF device pair comprises an n-type transistor, and gates of the second and fourth transistors of each PUF device pair are coupled to the power supply voltage node.

13. The PUF circuit of claim 11, wherein the power distribution node comprises a reference voltage node, each of the first and third transistors of each PUF device pair comprises an n-type transistor, the second transistor of each PUF device pair is configured as a diode coupled between the corresponding first transistor and the reference voltage node, and the fourth transistor of each PUF device pair is configured as a diode coupled between the corresponding third transistor and the reference voltage node.

14. The PUF circuit of claim 11, wherein the power distribution node comprises a power supply voltage node, the PUF circuit further comprises a reference voltage node, each of the first through fourth transistors of each PUF device pair comprises a p-type transistor, and gates of the second and fourth transistors of each PUF device pair are coupled to the reference voltage node.

15. The PUF circuit of claim 11, wherein the power distribution node comprises a power supply voltage node, each of the first and third transistors of each PUF device pair comprises a p-type transistor, the second transistor of each PUF device pair is configured as a diode coupled between the corresponding first transistor and the power supply voltage node, and the fourth transistor of each PUF device pair is configured as a diode coupled between the corresponding third transistor and the power supply voltage node.

16. An integrated circuit (IC) device comprising:

a semiconductor substrate;

a first stacked transistor structure positioned in the semiconductor substrate, and comprising first and second transistors coupled in series between a first bit line and a first node, arranged on a first side of the semiconductor substrate, and a power supply line arranged on a second side opposite the first side of the semiconductor substrate; and a second stacked transistor structure positioned in the semiconductor substrate, and comprising third and fourth transistors coupled in series between a second bit line and a second node, arranged on the first side of the semiconductor substrate, and the power supply line arranged on the second side of the semiconductor substrate, wherein the first node and the second node are electrically coupled to the power supply line.

17. The IC device of claim 16, wherein the first transistor comprises a first source/drain (S/D) terminal electrically coupled to the first bit line, a second S/D terminal electrically coupled to a first S/D terminal of the second transistor, and a gate electrically coupled to a word line arranged on the first side of the semiconductor substrate, the third transistor comprises a first S/D terminal electrically coupled to the second bit line, a second S/D terminal electrically coupled to a first S/D terminal of the fourth transistor, and a gate electrically coupled to the word line arranged on the first side of the semiconductor substrate, and each of the second and fourth transistors comprises a second S/D terminal electrically coupled to the power supply line.

18. The IC device of claim 16, further comprising:

a sense amplifier, wherein the first bit line is electrically coupled to a first input terminal of the sense amplifier, and the second bit line is electrically coupled to a second input terminal of the sense amplifier.

19. The IC device of claim 16, wherein the power supply line is configured to have a reference voltage level, each of the first and third transistors comprises an n-type transistor, each of the second and fourth transistors comprises a p-type transistor, and each of the second and fourth transistors further comprises a gate electrically coupled to the power supply line.

20. The IC device of claim 16, wherein the power supply line is configured to have a power supply voltage level, each of the first and third transistors comprises a p-type transistor, each of the second and fourth transistors comprises an n-type transistor, and each of the second and fourth transistors further comprises a gate electrically coupled to the power supply line.

* * * * *